(12) United States Patent
Zhou et al.

(10) Patent No.: US 10,818,680 B2
(45) Date of Patent: Oct. 27, 2020

(54) SPLIT GATE NON-VOLATILE MEMORY CELLS AND LOGIC DEVICES WITH FINFET STRUCTURE, AND METHOD OF MAKING SAME

(71) Applicant: Silicon Storage Technology, Inc., San Jose, CA (US)

(72) Inventors: Feng Zhou, Fremont, CA (US); Jinho Kim, Saratoga, CA (US); Xian Liu, Sunnyvale, CA (US); Serguei Jourba, Aix en Provence (FR); Catherine Decobert, Pourrieres (FR); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/578,104

(22) Filed: Sep. 20, 2019

(65) Prior Publication Data

US 2020/0013789 A1 Jan. 9, 2020

Related U.S. Application Data

(62) Division of application No. 15/957,615, filed on Apr. 19, 2018, now Pat. No. 10,468,428.

(51) Int. Cl.
*H01L 27/11531* (2017.01)
*H01L 29/423* (2006.01)
(Continued)

(52) U.S. Cl.
CPC .. *H01L 27/11531* (2013.01); *H01L 27/11521* (2013.01); *H01L 29/1083* (2013.01);
(Continued)

(58) Field of Classification Search
CPC ......... H01L 27/11531; H01L 27/11521; H01L 29/1083; H01L 29/42328; H01L 29/66537;
(Continued)

(56) References Cited

U.S. PATENT DOCUMENTS 5,029,130 A 7/1991 Yeh
6,747,310 B2 6/2004 Fan
(Continued)

FOREIGN PATENT DOCUMENTS

TW 200737360 A 10/2007

OTHER PUBLICATIONS

U.S. Appl. No. 15/933,124, filed Mar. 22, 2018, Jourba et al., entitled "Two Transistor Finfet-Based Split Gate Non-volatile Floating Gate Flash Memory and Method of Fabrication".
(Continued)

*Primary Examiner* — Tong-Ho Kim
(74) *Attorney, Agent, or Firm* — DLA Piper LLP (US)

(57) ABSTRACT

A semiconductor substrate having an upper surface with a plurality of upwardly extending fins. A memory cell formed on a first of the fins and including spaced apart source and drain regions in the first fin, with a channel region extending therebetween along top and side surfaces of the first fin, a floating gate that extends along a first portion of the channel region, a select gate that extends along a second portion of the channel region, a control gate that extends along and is insulated from the floating gate, and an erase gate that extends along and is insulated from the source region. A logic device formed on a second of the fins and including spaced apart logic source and logic drain regions in the second fin, with a logic channel region of the second fin extending therebetween, and a logic gate that extends along the logic channel region.

9 Claims, 29 Drawing Sheets

(51) Int. Cl.
    *H01L 29/10*      (2006.01)
    *H01L 29/66*      (2006.01)
    *H01L 27/11521*      (2017.01)
    *H01L 29/78*      (2006.01)
    *H01L 29/788*      (2006.01)

(52) U.S. Cl.
    CPC .. *H01L 29/42328* (2013.01); *H01L 29/66537* (2013.01); *H01L 29/66795* (2013.01); *H01L 29/66825* (2013.01); *H01L 29/7851* (2013.01); *H01L 29/7883* (2013.01)

(58) Field of Classification Search
    CPC ......... H01L 29/66795; H01L 29/66825; H01L 29/7851; H01L 29/7883
    USPC ........................................... 257/319
    See application file for complete search history.

(56) References Cited

U.S. PATENT DOCUMENTS

| | | | |
|---|---|---|---|
| 7,315,056 B2 | 1/2008 | Klinger | |
| 7,329,580 B2 | 2/2008 | Choi | |
| 7,410,913 B2 | 8/2008 | Lee | |
| 7,423,310 B2 | 9/2008 | Verhoeven | |
| 7,868,375 B2 | 1/2011 | Liu | |
| 7,927,994 B1 | 4/2011 | Liu | |
| 8,068,370 B2 | 11/2011 | Lue | |
| 8,148,768 B2 | 4/2012 | Do et al. | |
| 8,420,476 B2 | 4/2013 | Booth, Jr. et al. | |
| 8,461,640 B2 | 6/2013 | Hu | |
| 8,710,485 B2 | 4/2014 | Saitoh et al. | |
| 8,941,153 B2 | 1/2015 | Lee et al. | |
| 9,276,005 B1 | 3/2016 | Zhou | |
| 9,276,006 B1 * | 3/2016 | Chen ................... H01L 29/7885 |
| 9,406,689 B2 | 8/2016 | Li | |
| 9,614,048 B2 | 4/2017 | Wu | |
| 9,634,018 B2 | 4/2017 | Su | |
| 2005/0012137 A1 | 1/2005 | Levi | |
| 2005/0280000 A1 * | 12/2005 | Ishii ...................... G11C 11/405 257/67 |
| 2006/0097310 A1 | 5/2006 | Kim | |
| 2006/0208307 A1 * | 9/2006 | Chang .................. H01L 27/115 257/315 |
| 2007/0158730 A1 | 7/2007 | Burnett | |
| 2008/0173921 A1 | 7/2008 | Li | |
| 2010/0320525 A1 | 12/2010 | Nagashima | |
| 2013/0270627 A1 | 10/2013 | Cheng | |
| 2016/0064398 A1 * | 3/2016 | Toh ................... H01L 27/11524 257/316 |
| 2016/0218110 A1 | 7/2016 | Yang et al. | |
| 2016/0379987 A1 * | 12/2016 | Liu ................... H01L 27/11524 257/316 |
| 2017/0117285 A1 | 4/2017 | Chen | |
| 2017/0125429 A1 | 5/2017 | Su et al. | |
| 2017/0243955 A1 | 8/2017 | Shinohara | |
| 2017/0271484 A1 | 9/2017 | Baars et al. | |
| 2017/0301683 A1 | 10/2017 | Chen | |
| 2017/0345840 A1 | 11/2017 | Su et al. | |

OTHER PUBLICATIONS

U.S. Appl. No. 16/028,244, filed Jul. 5, 2018 entitled "Split Gate Non-Volatile Memory Cells With Three-Dimensional FINFET Structure, and Method of Making Same," Jourba et al.

U.S. Appl. No. 16/422,740, filed May 24, 2019 entitled "Method of Making Split Gate Non-Volatile Memory Cells With Three-Dimensional FINFET Structure, and Method of Making Same," Jourba, et al.

U.S. Appl. No. 16/208,150, filed Dec. 3, 2008 entitled "Split Gate Non-volatile Memory Cells with FINFET Structure and HKMG Memory and Logic Gates, and Method of Making Same" Zhou et al.

U.S. Appl. No. 16/208,288, filed Dec. 3, 2018 entitled "FINFET-Based Split Gate Non-volatile Flash Memory With Extended Source Line FINFET, and Method of Fabrication," Jourba et al.

* cited by examiner

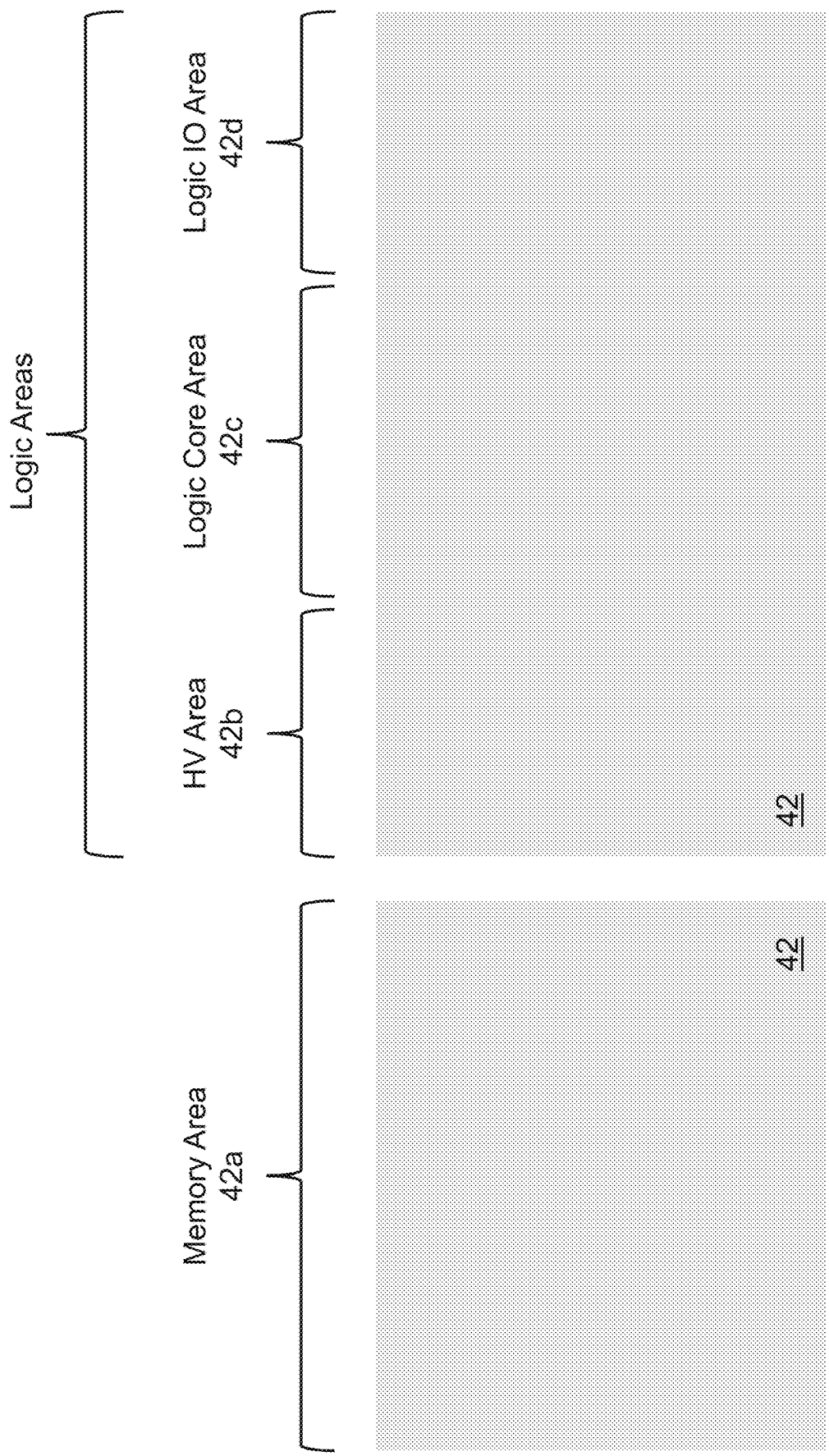

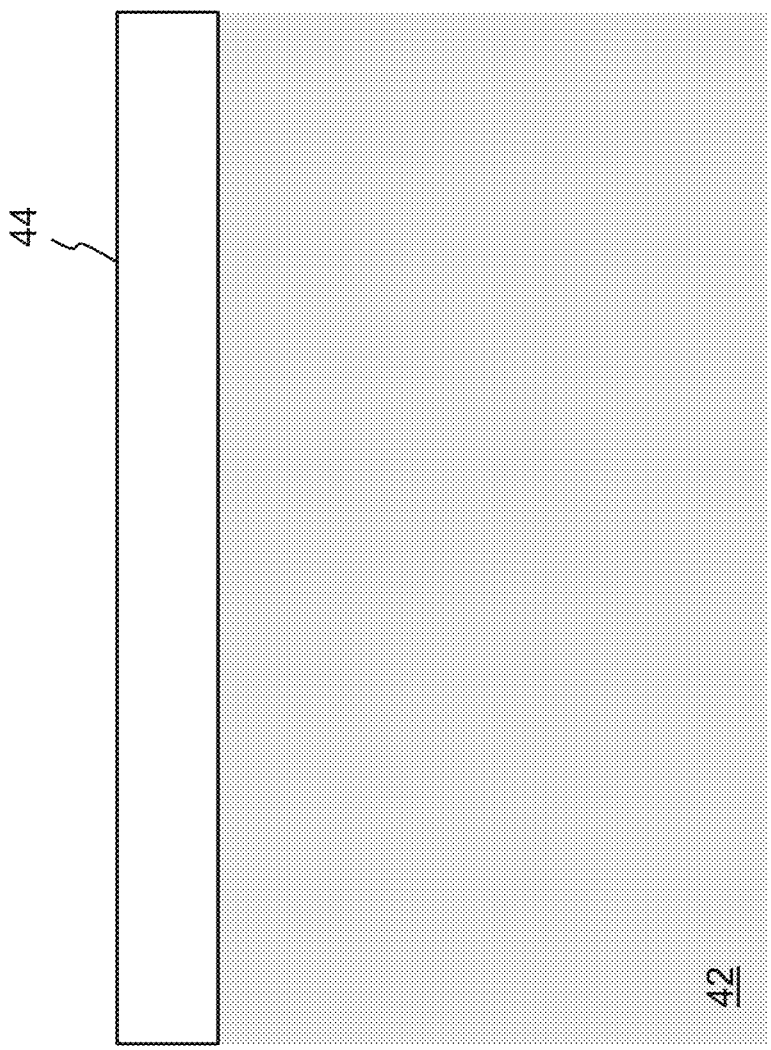
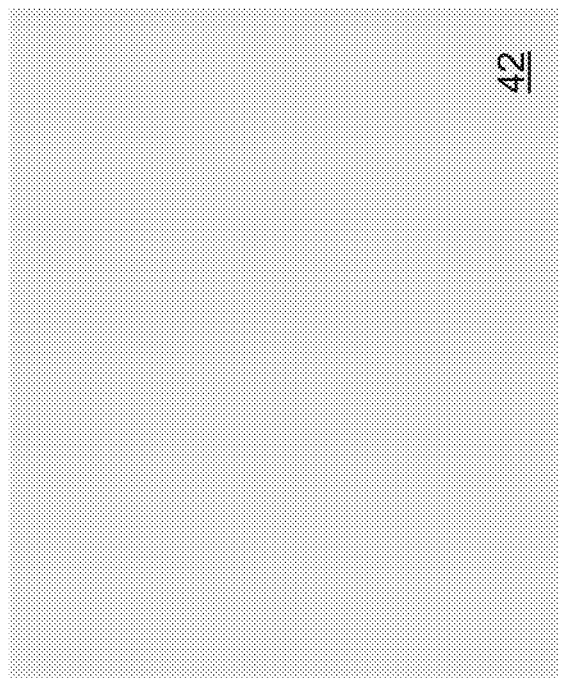

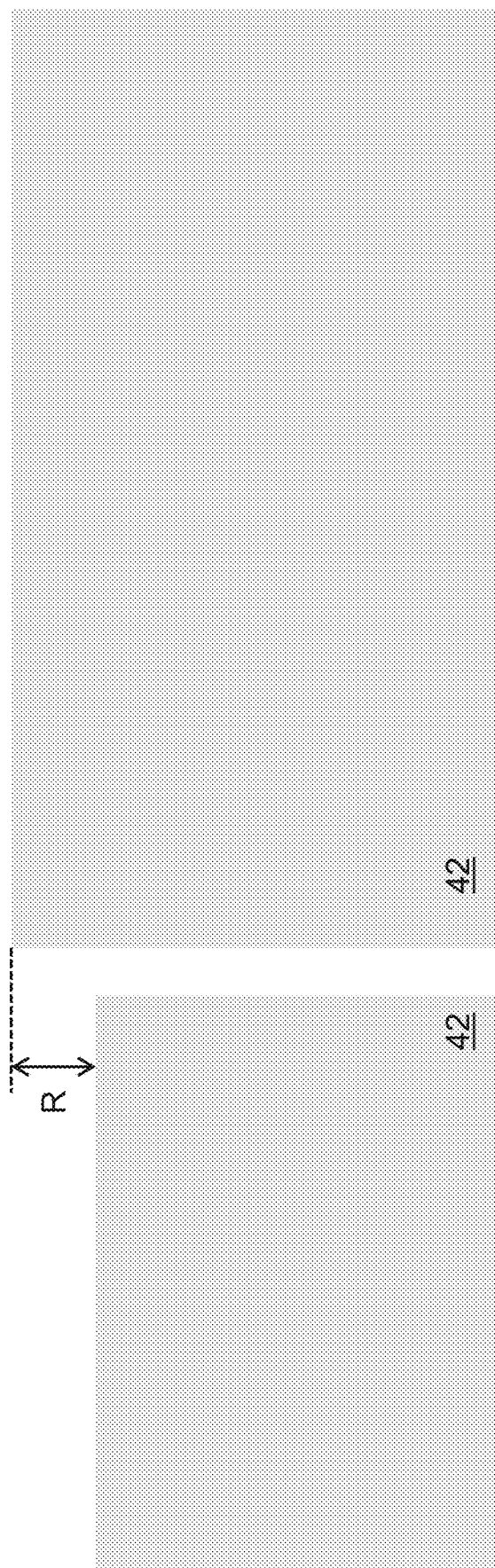

(along c-c)

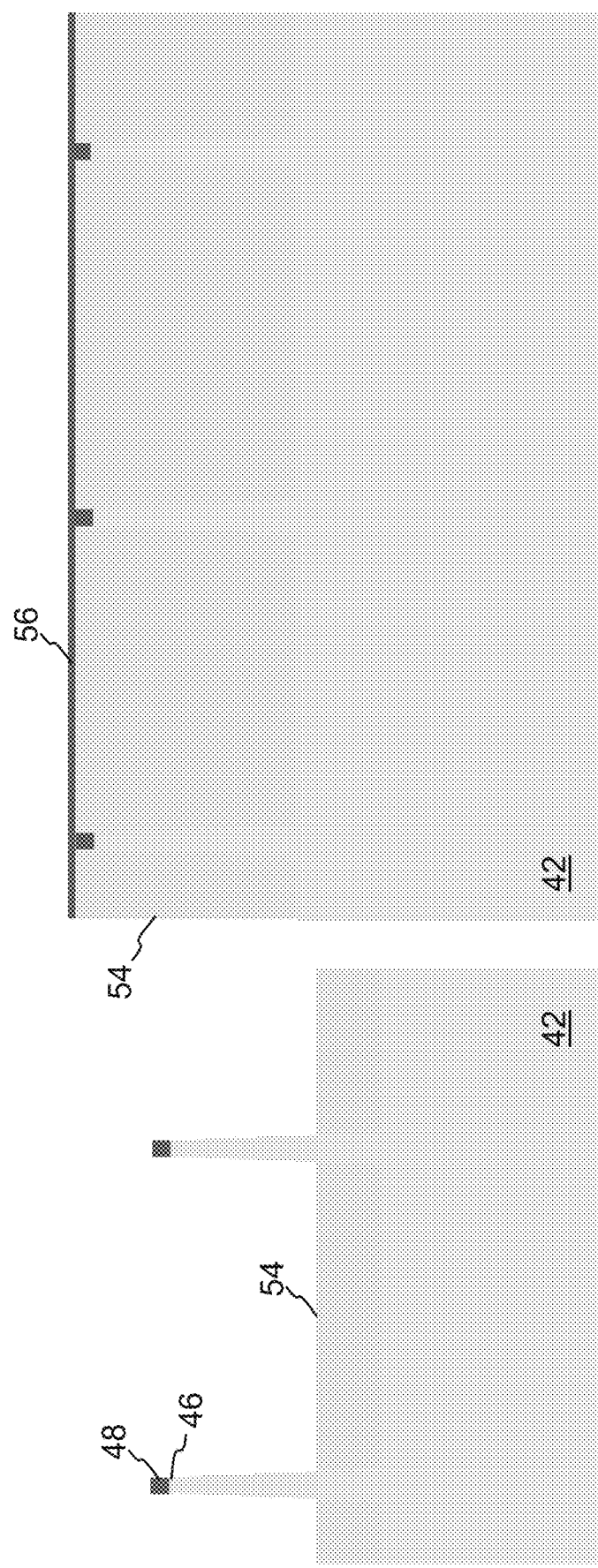

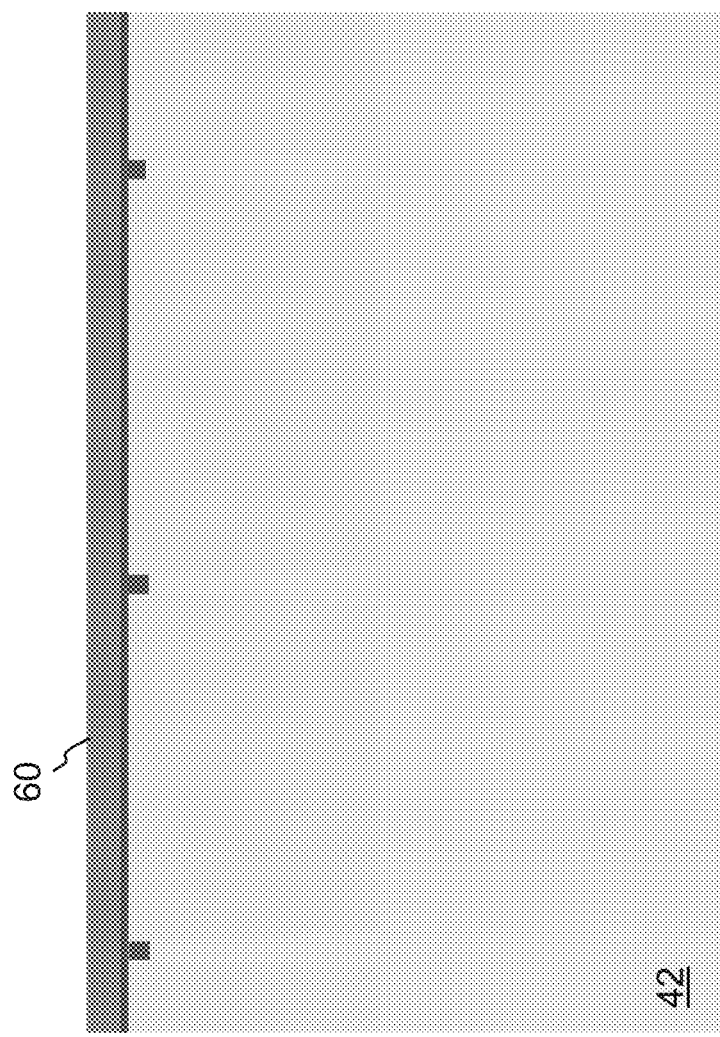
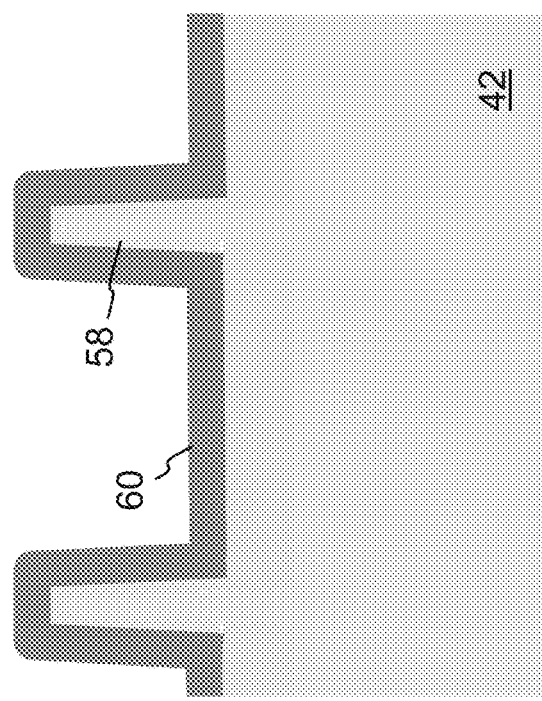

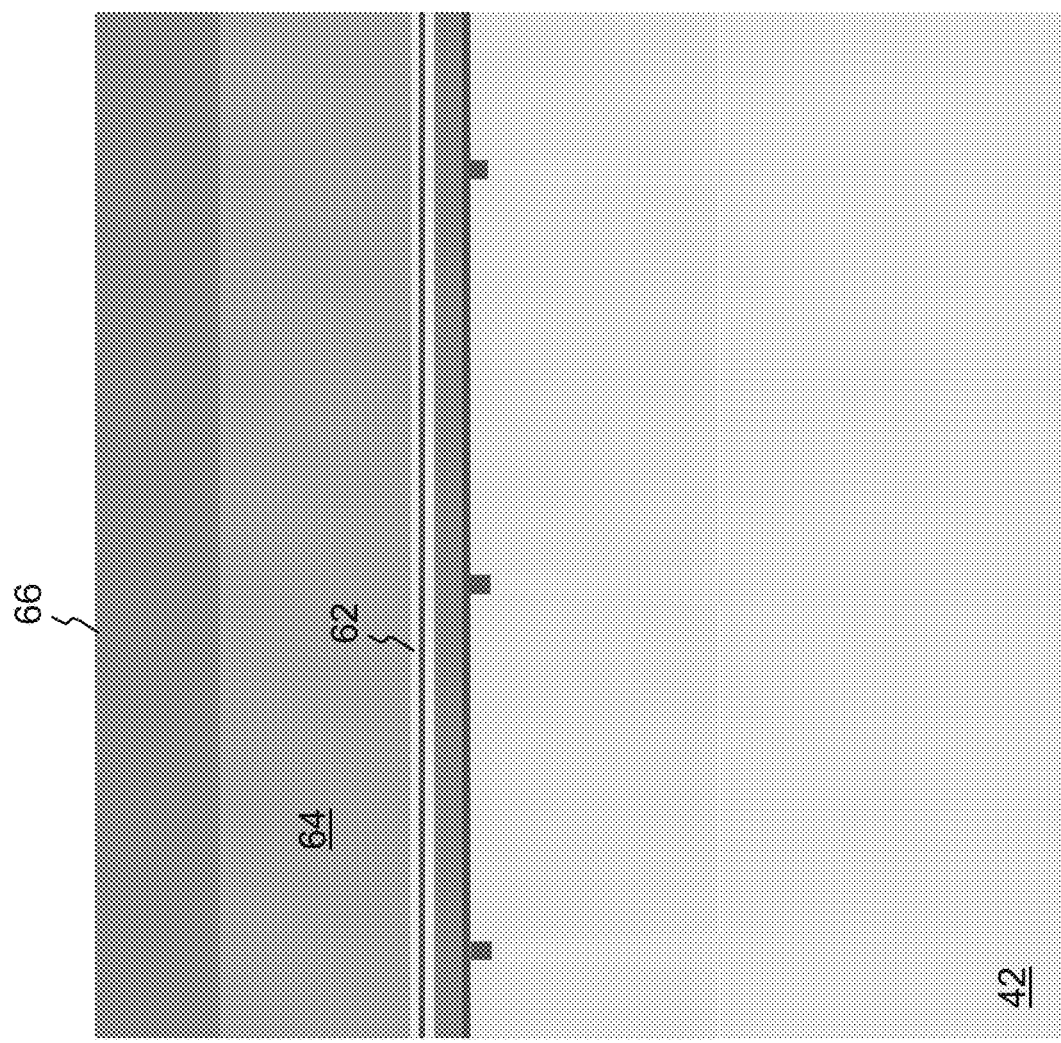
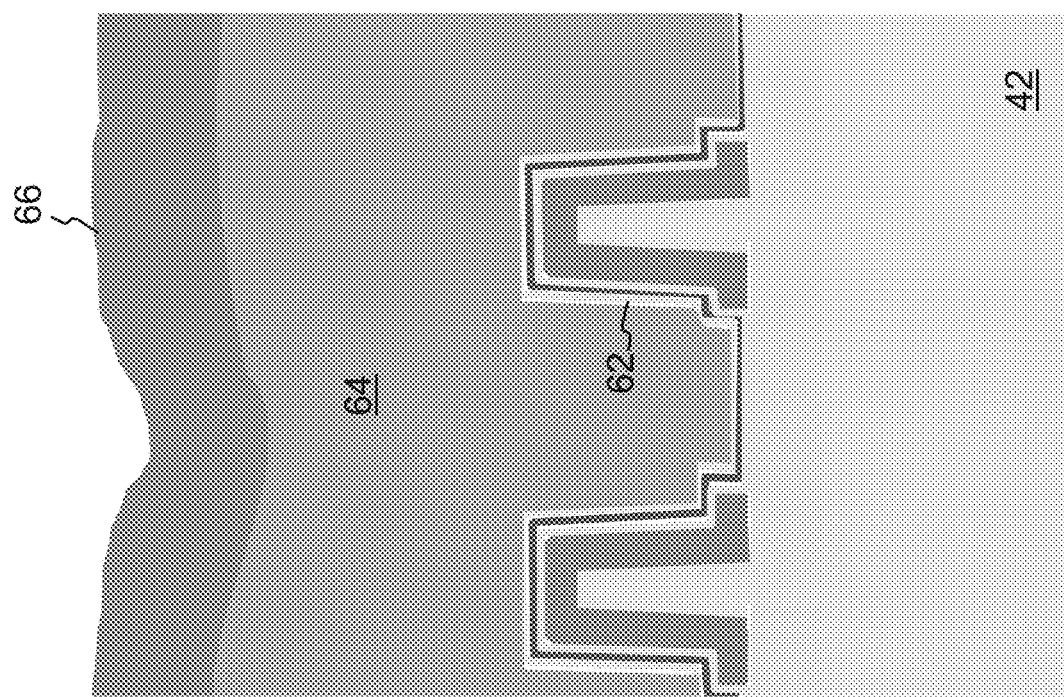
FIG. 9A (along c-c)
FIG. 9B

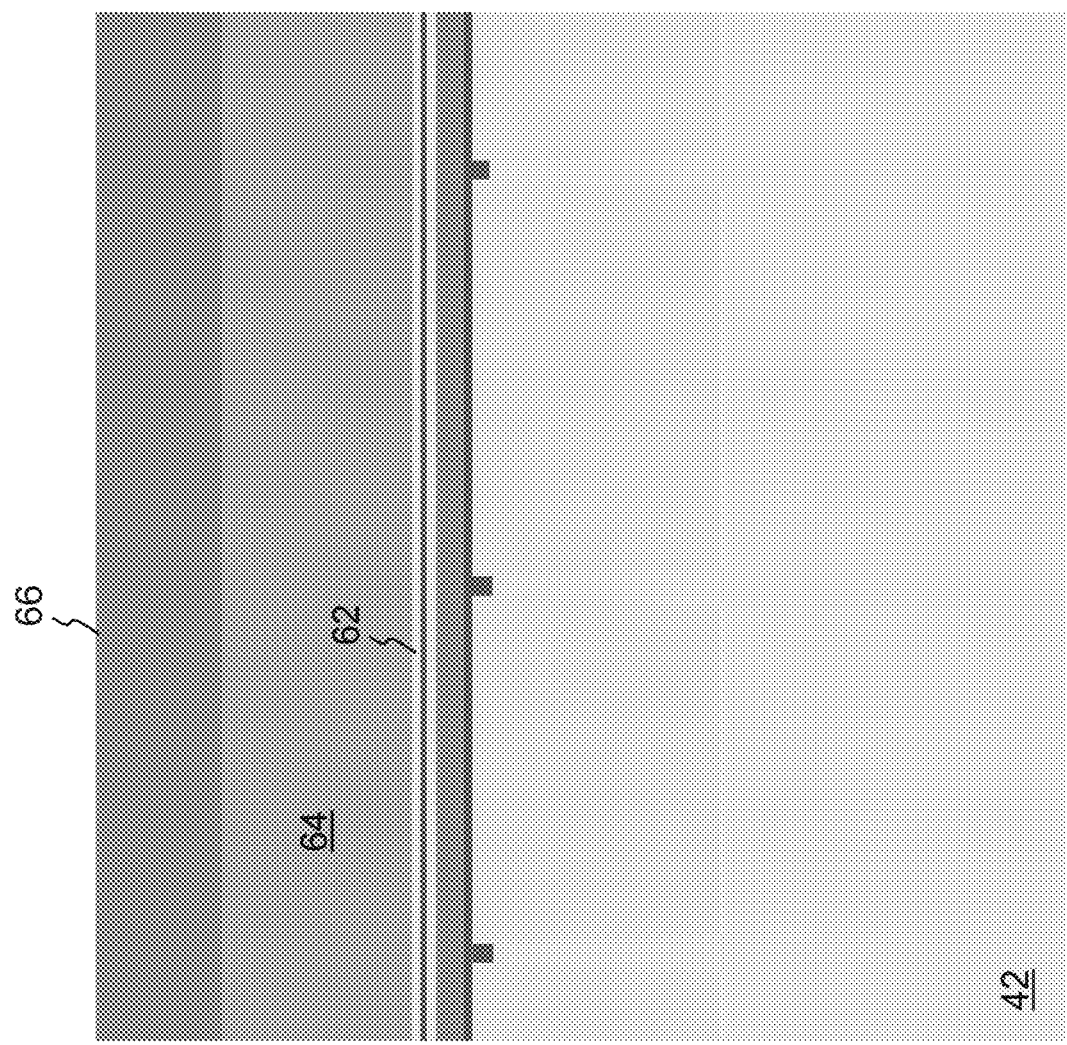
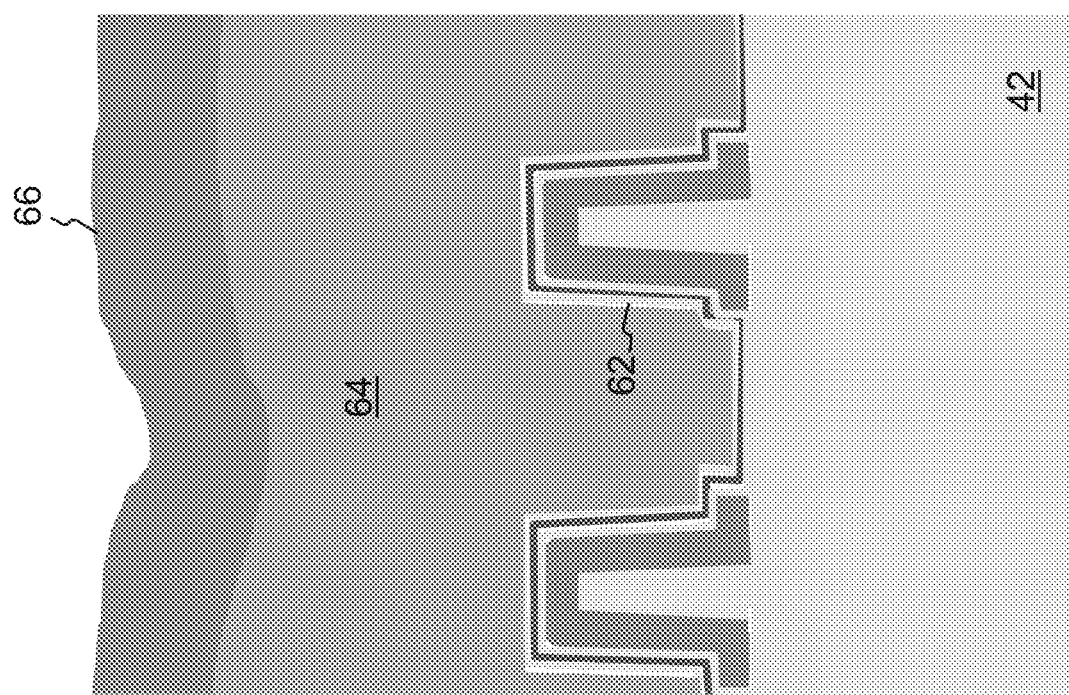
FIG. 10A (along c-c)
FIG. 10B

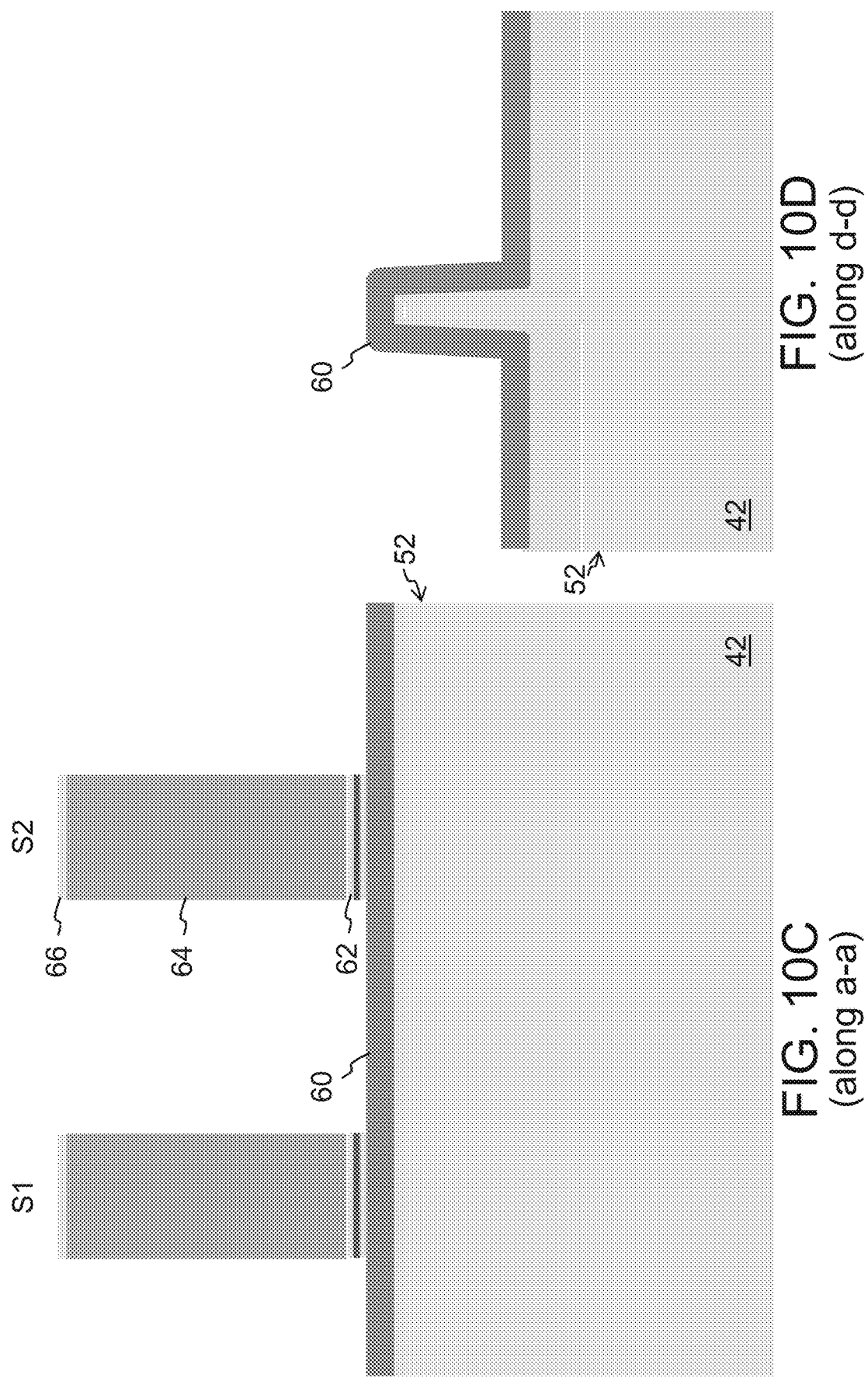

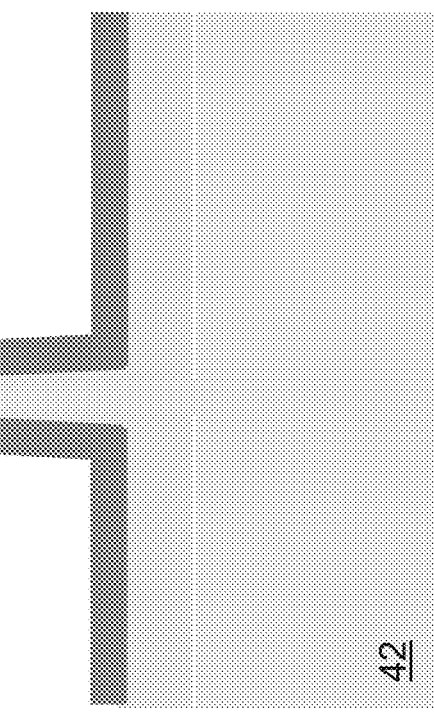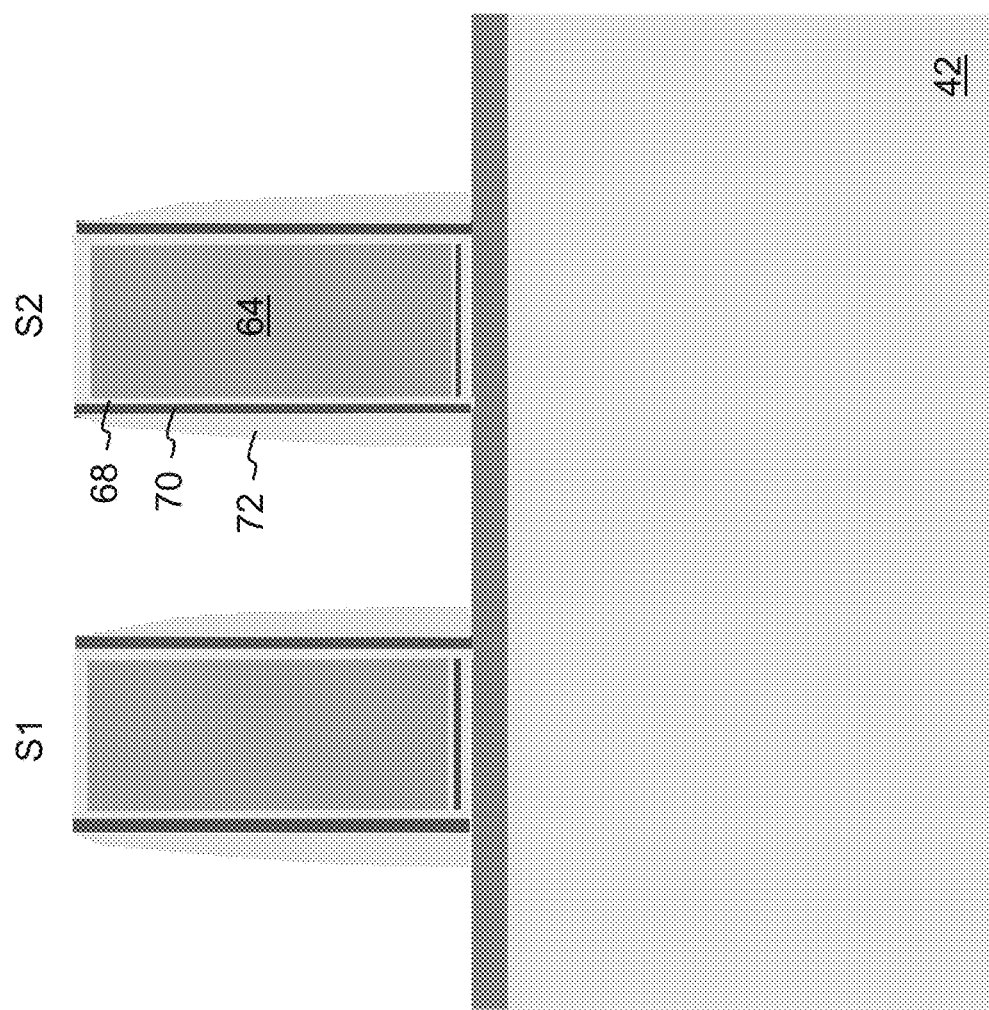

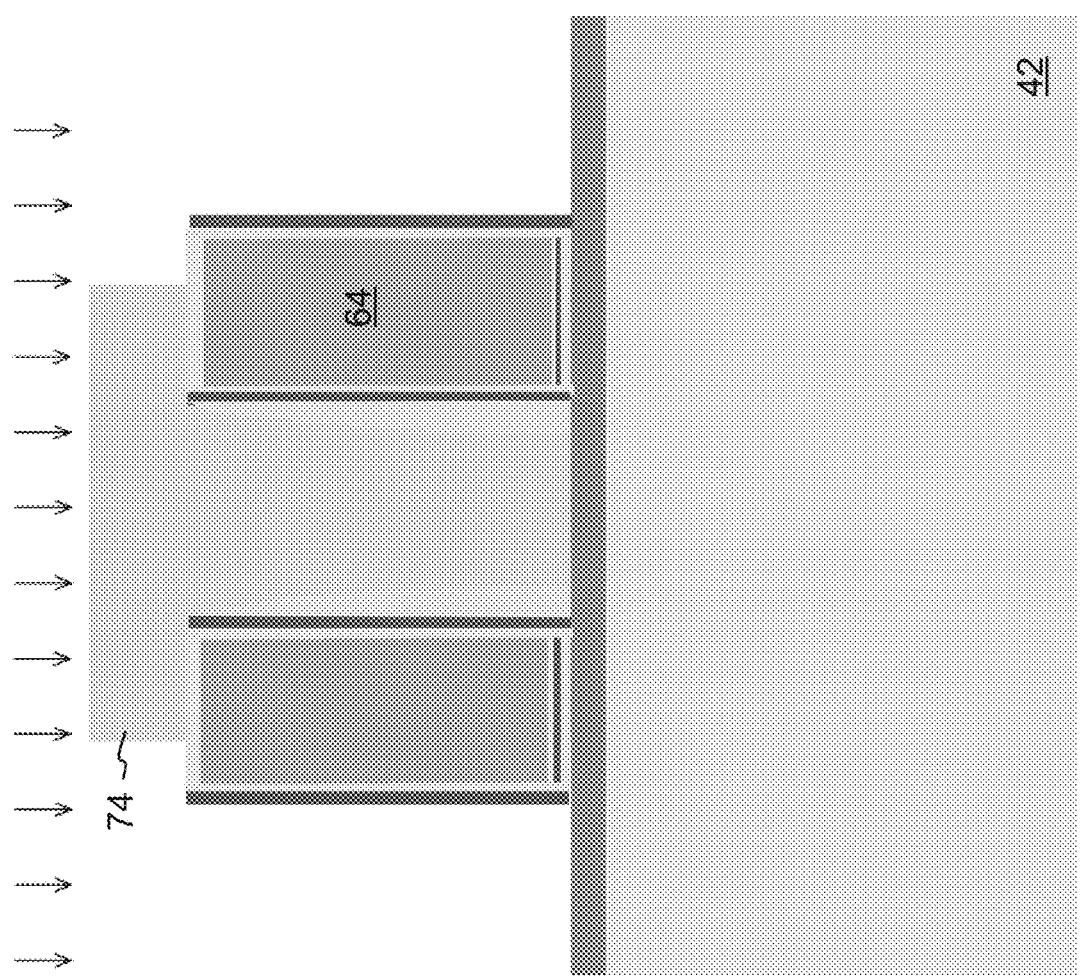
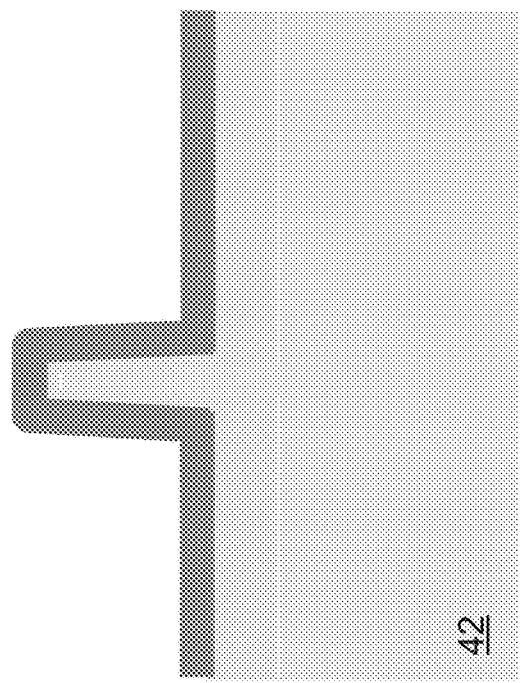
FIG. 12C (along a-a)
FIG. 12D (along d-d)

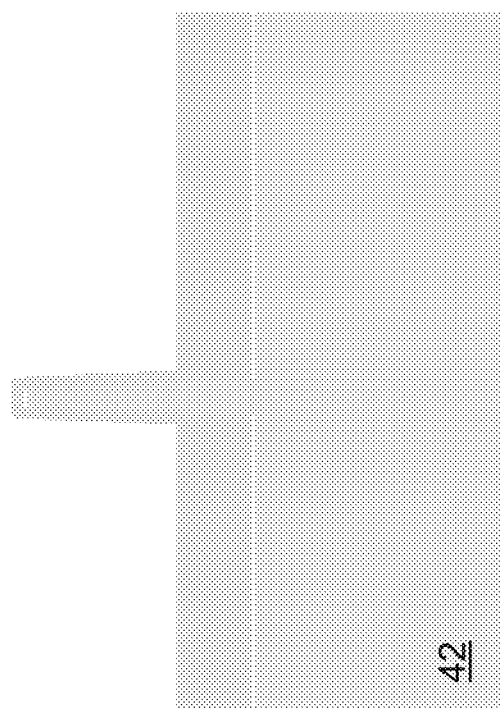
FIG. 13D (along d-d)
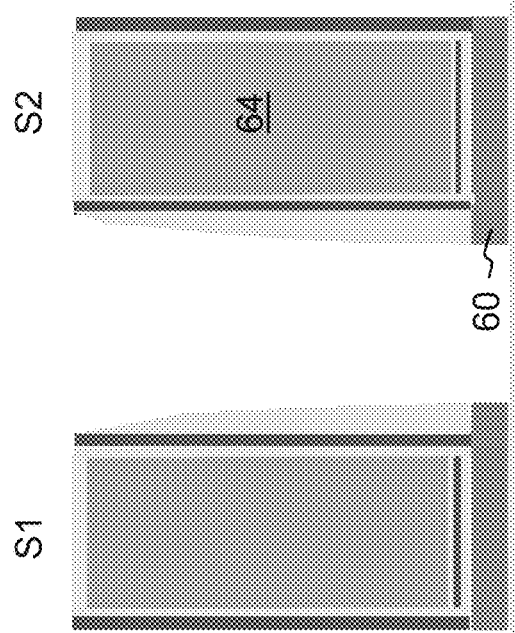
FIG. 13C (along a-a)

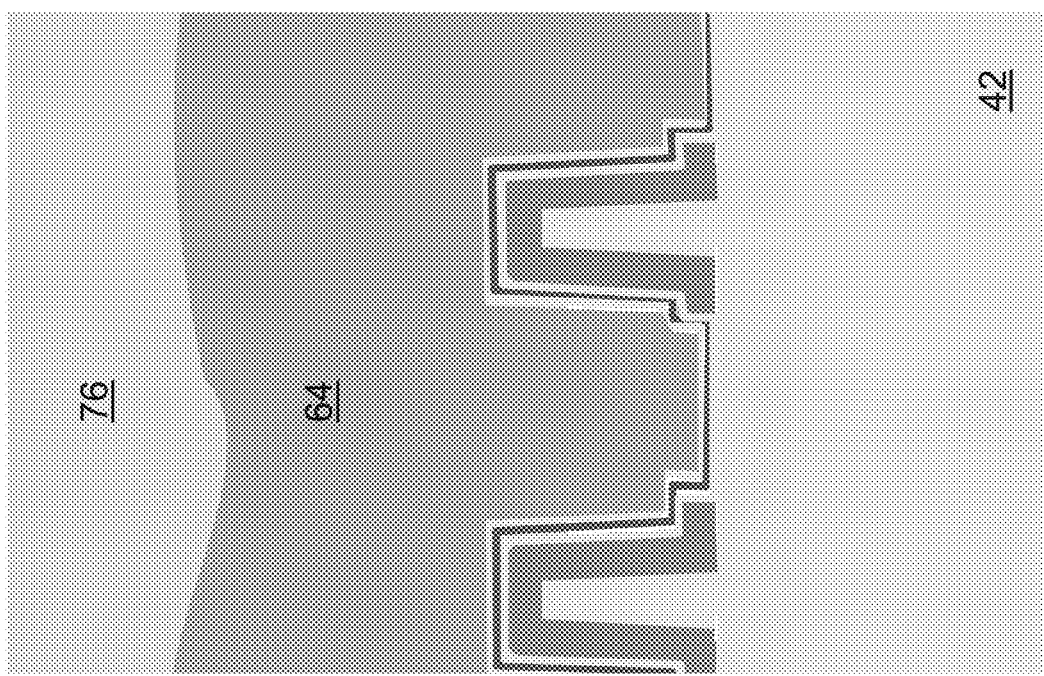
FIG. 14A (along c-c)
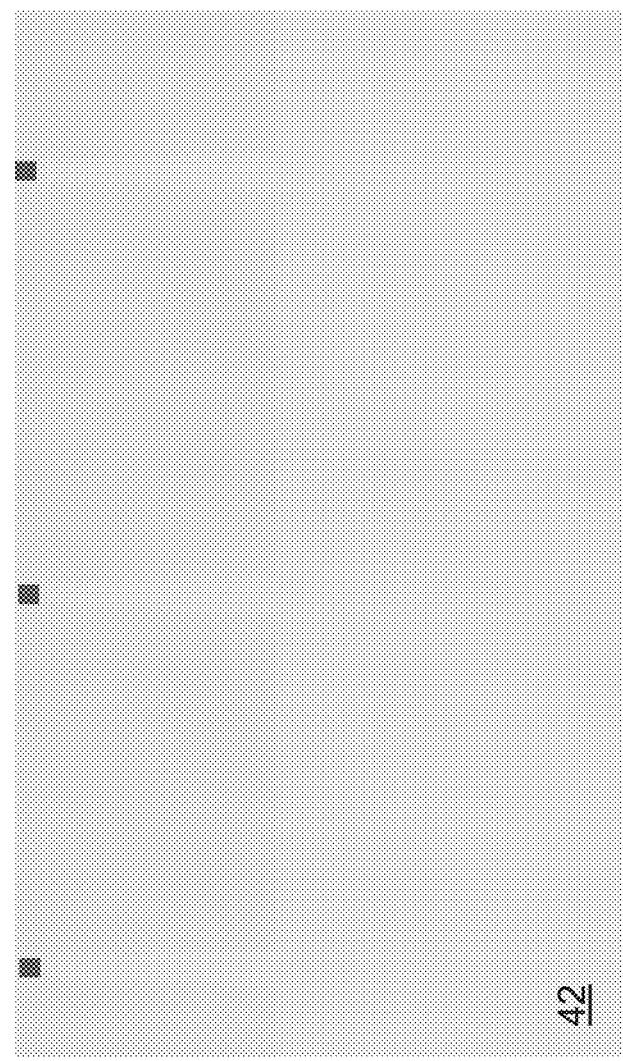
FIG. 14B

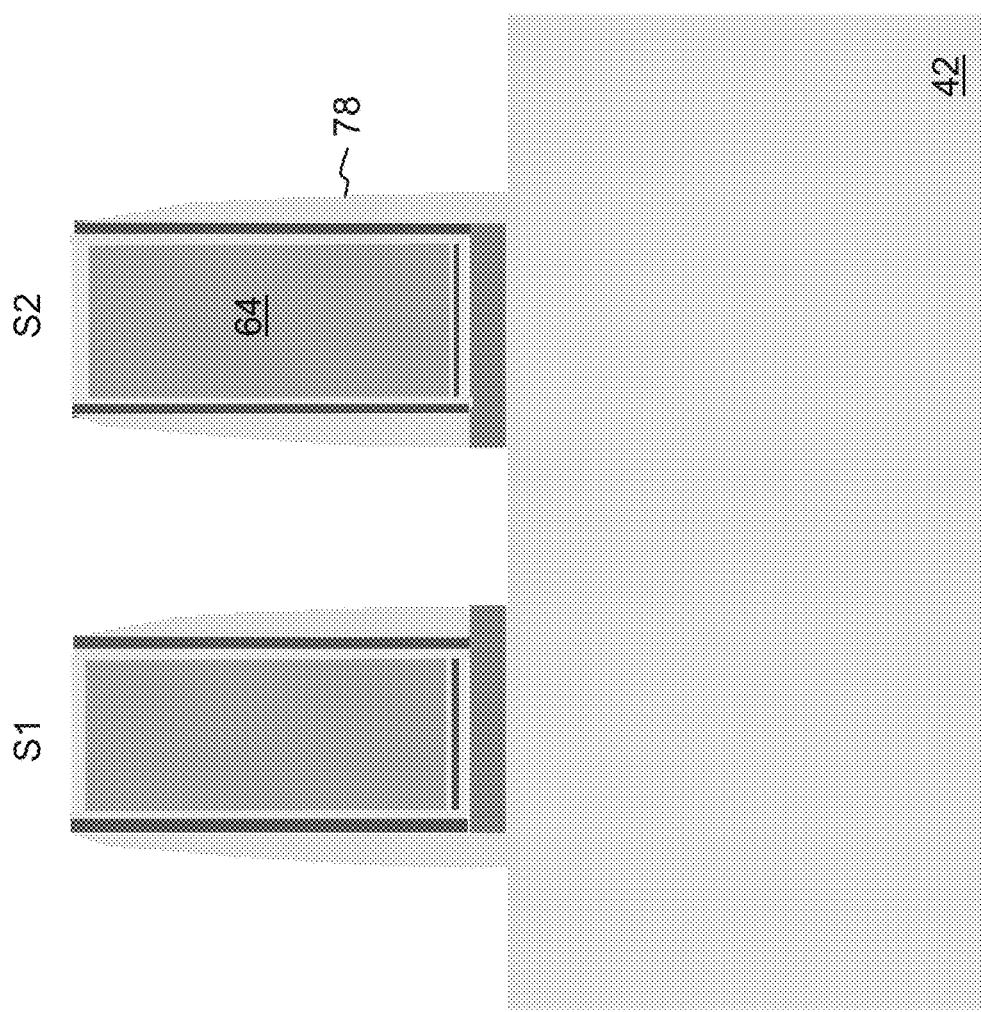
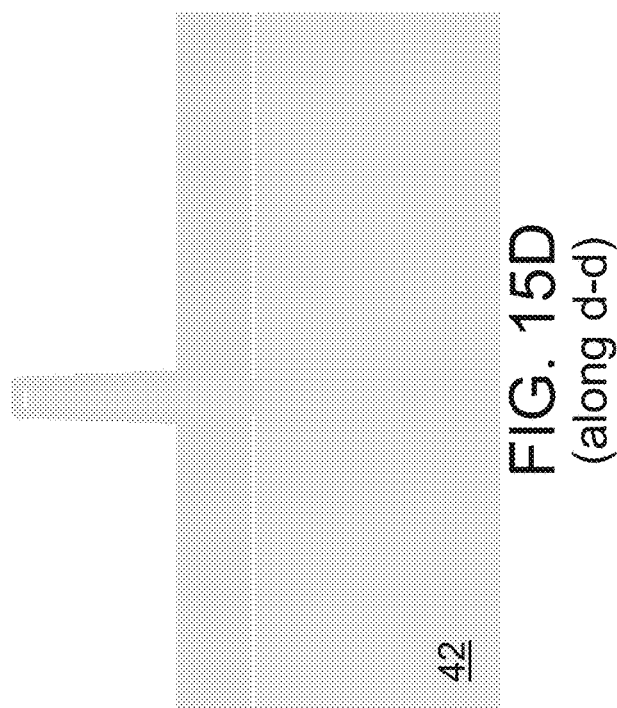

(along c-c)

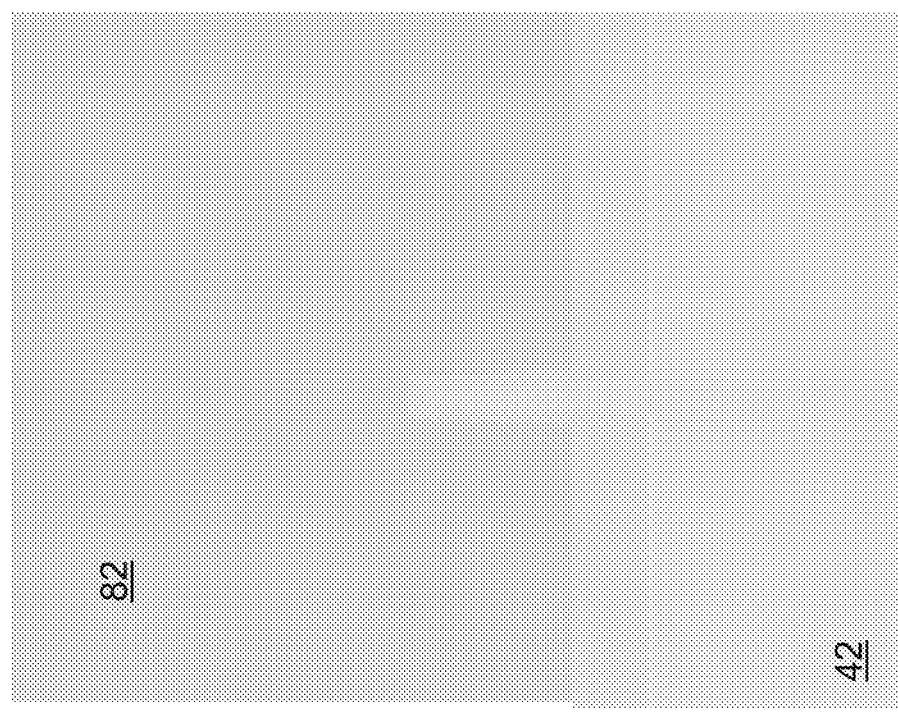
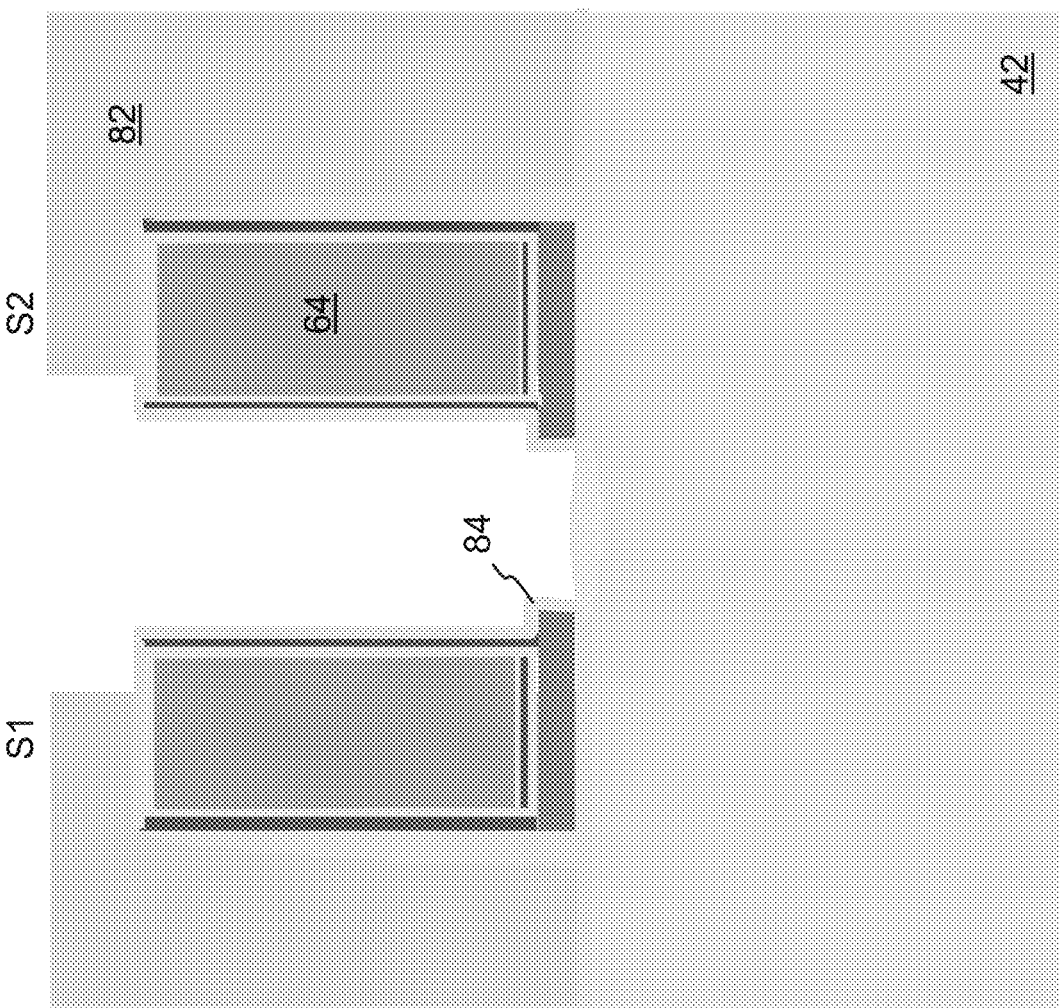
FIG. 17C (along a-a)
FIG. 17D (along d-d)

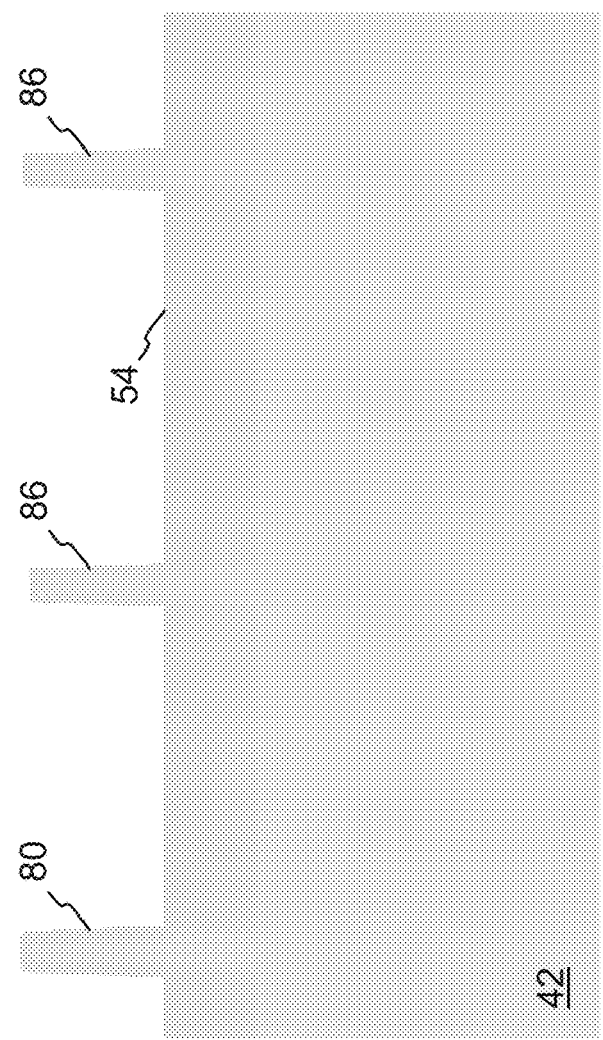
FIG. 18A (along c-c)
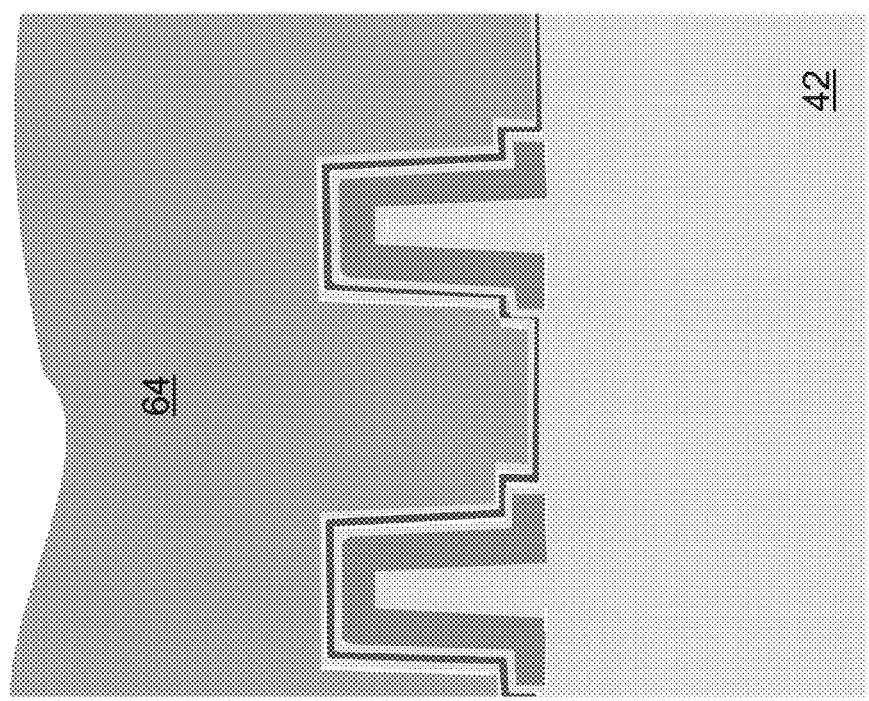
FIG. 18B

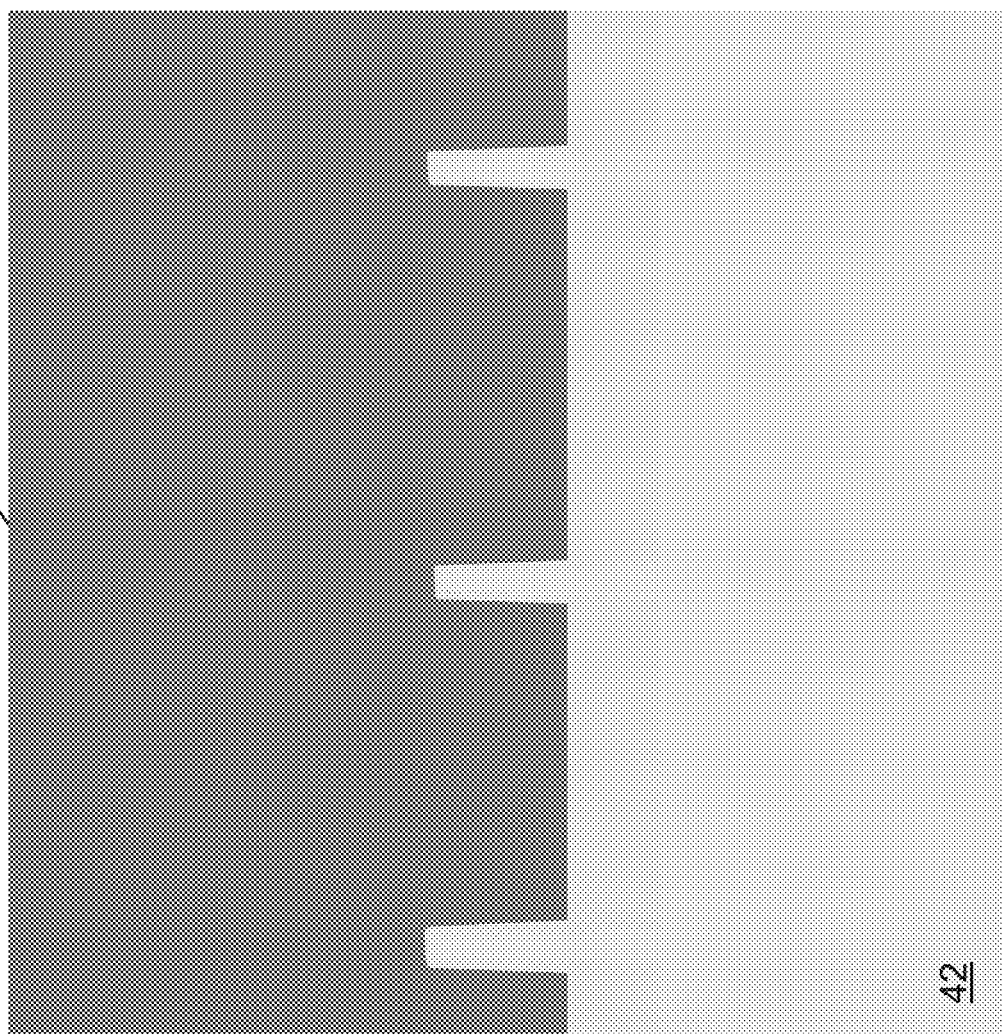
FIG. 19A (along c-c)
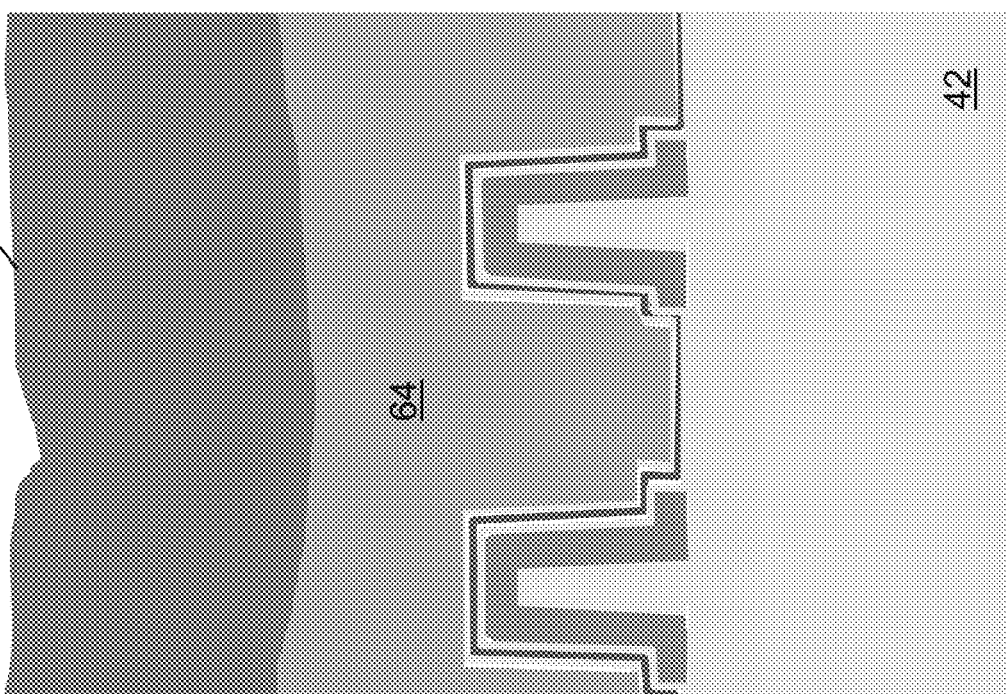
FIG. 19B

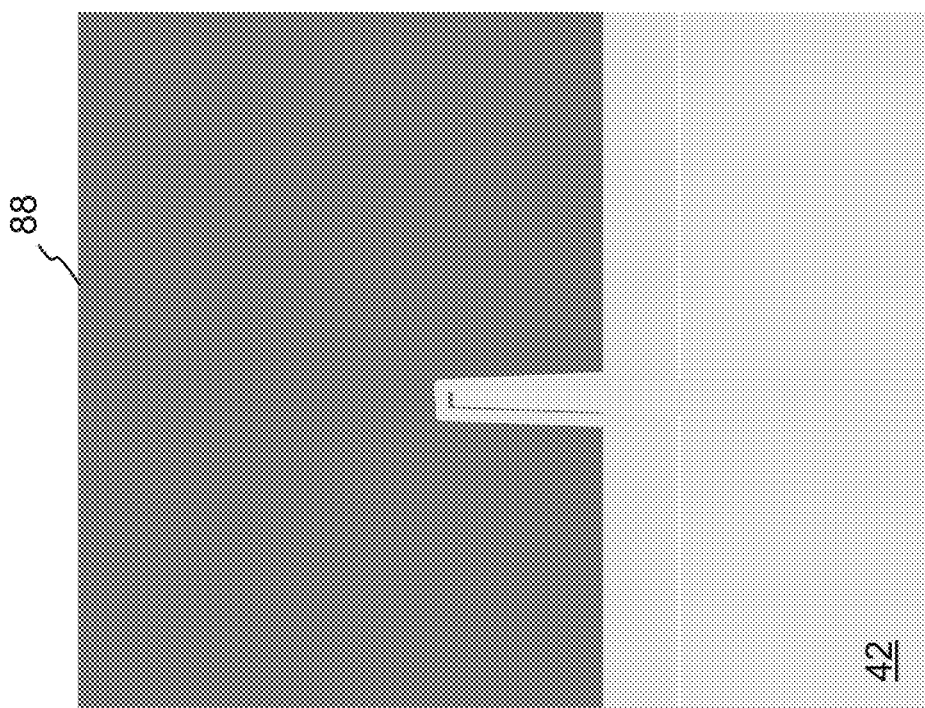
FIG. 19D (along d-d)
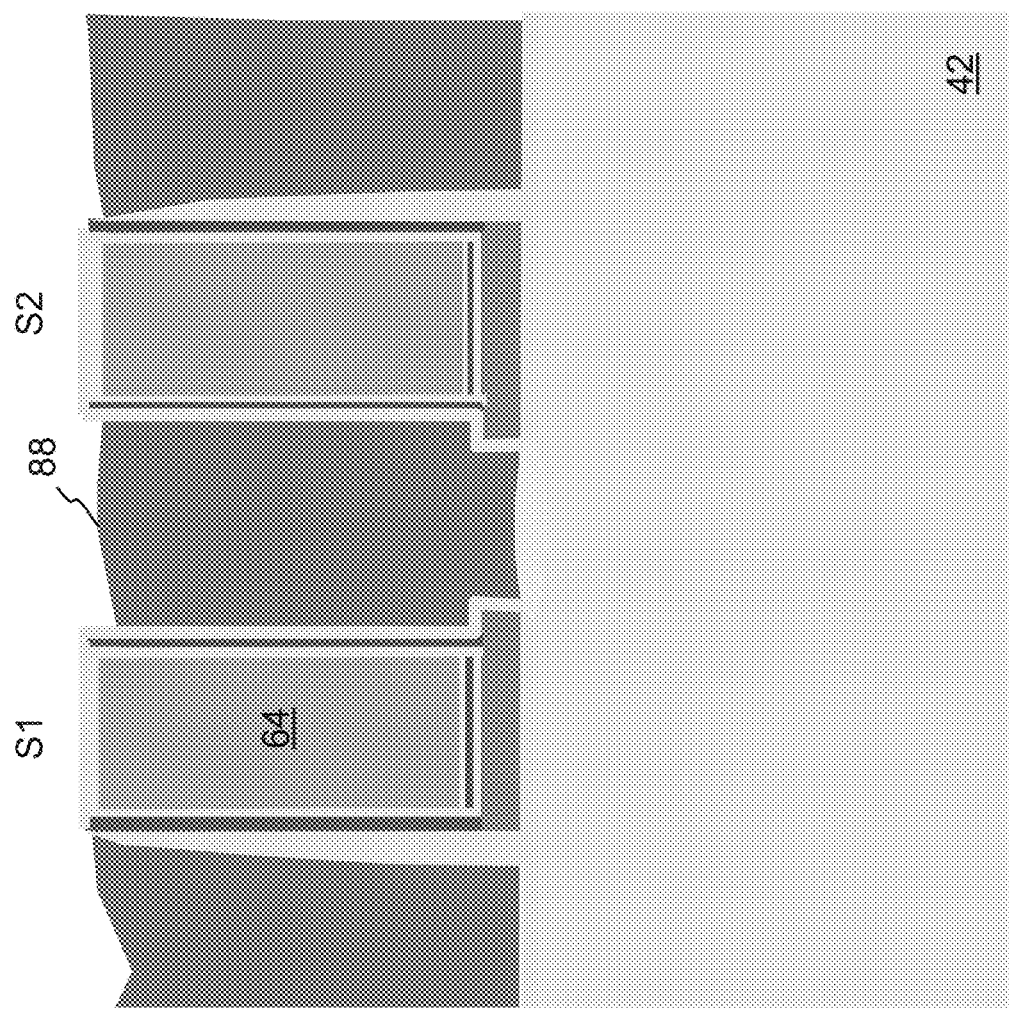
FIG. 19C (along a-a)

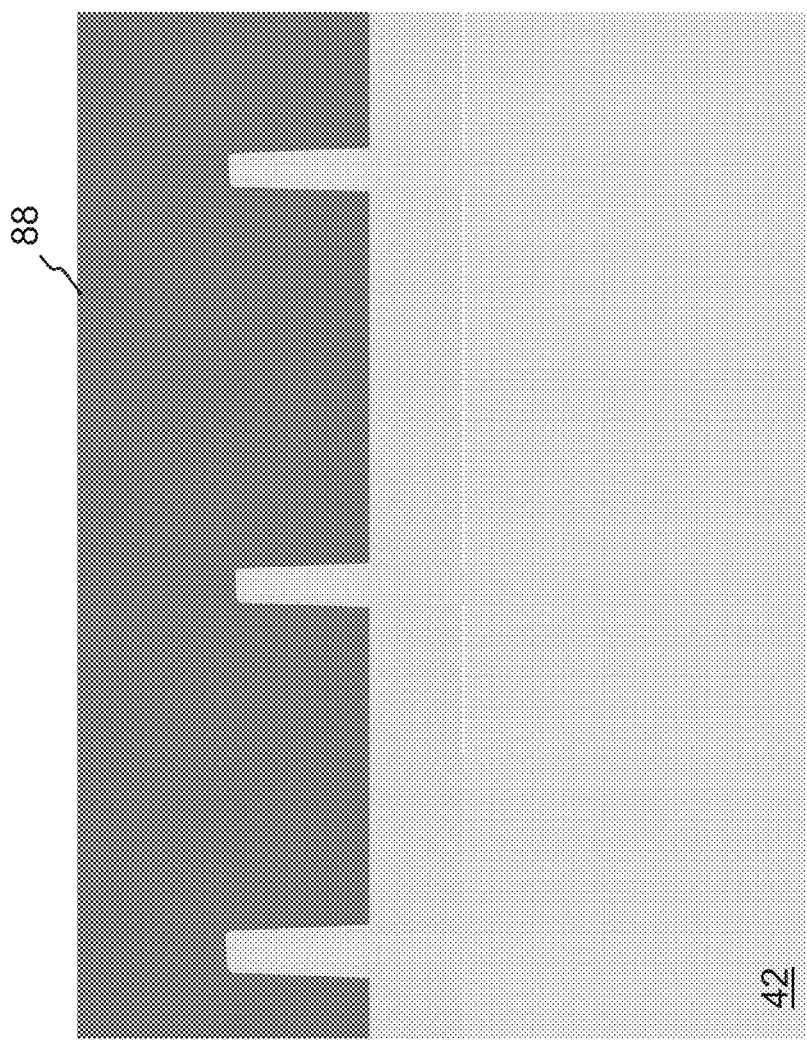
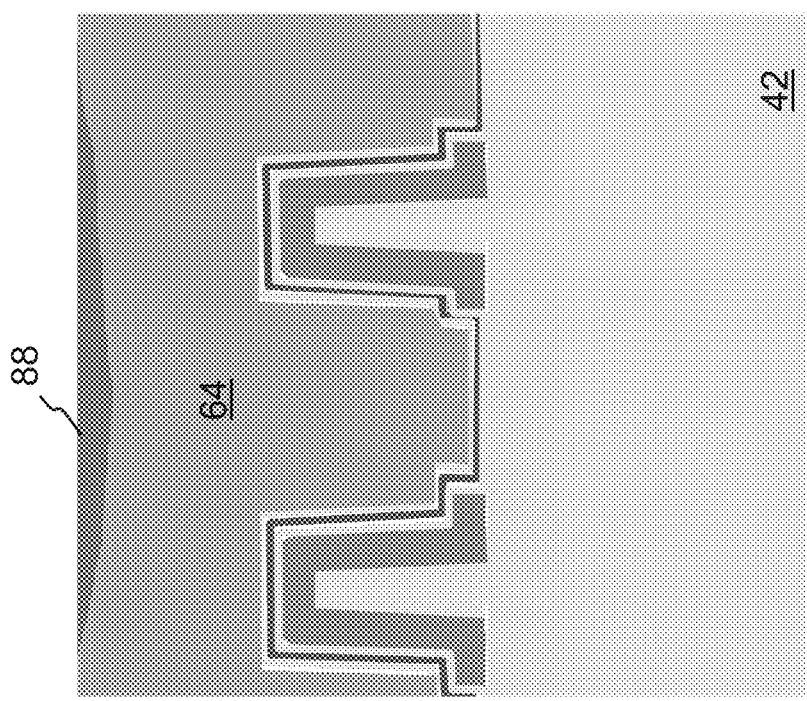
FIG. 20A (along c-c)
FIG. 20B

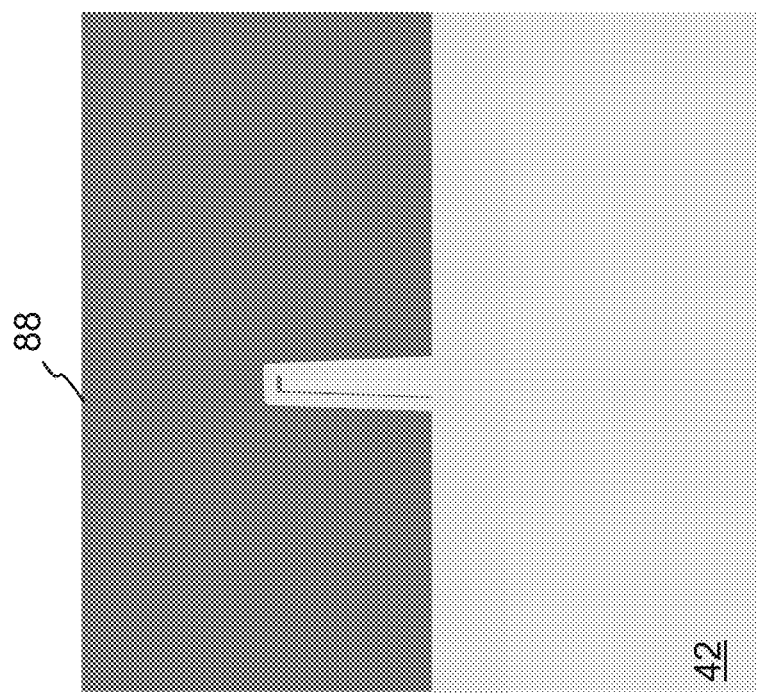
FIG. 20D (along d-d)
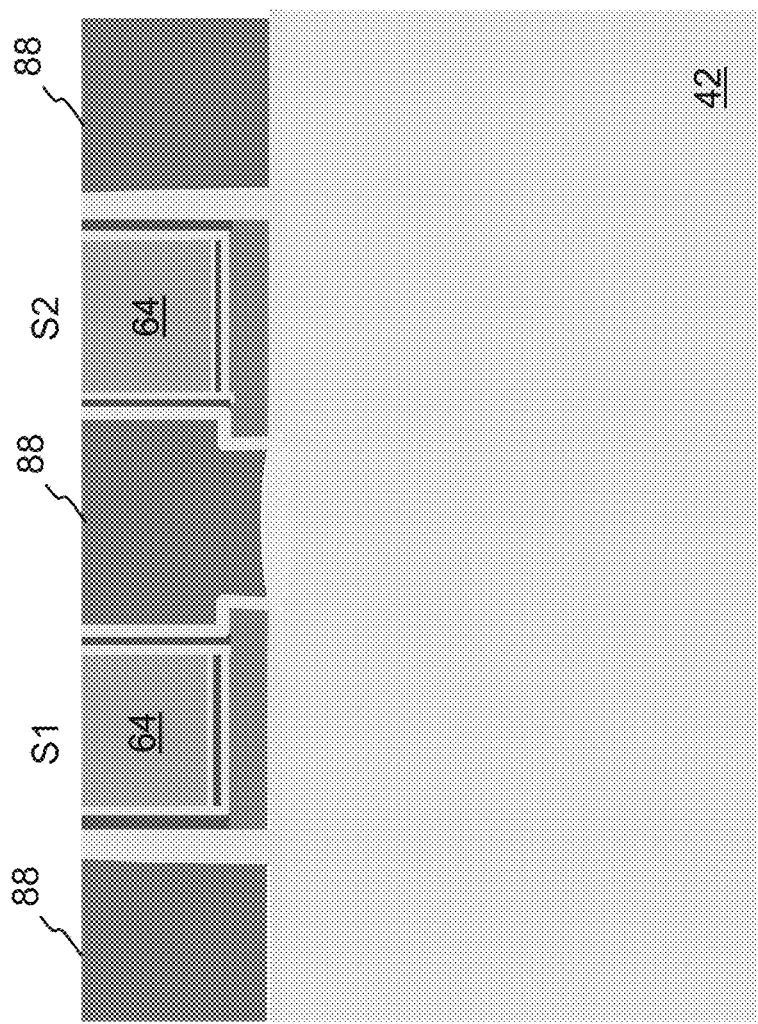
FIG. 20C (along a-a)

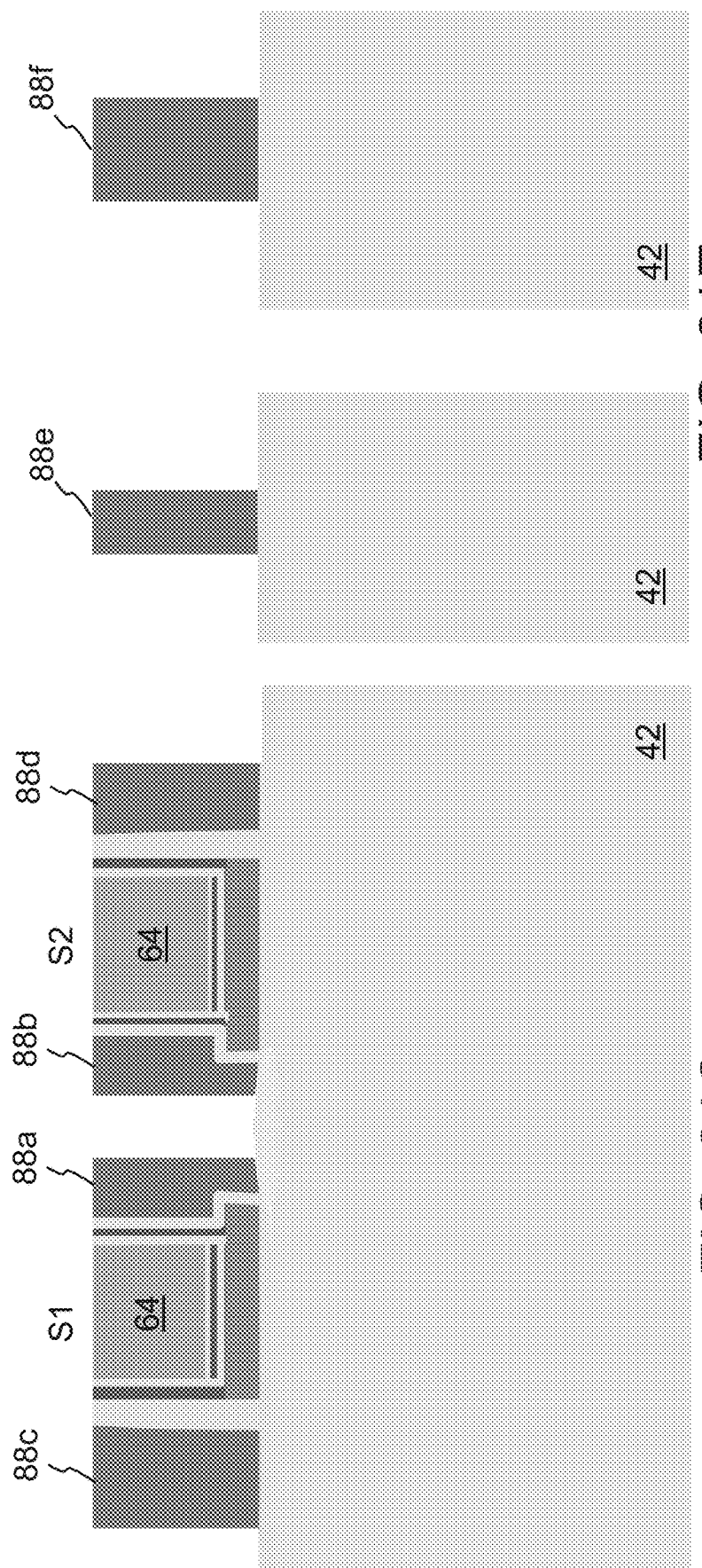

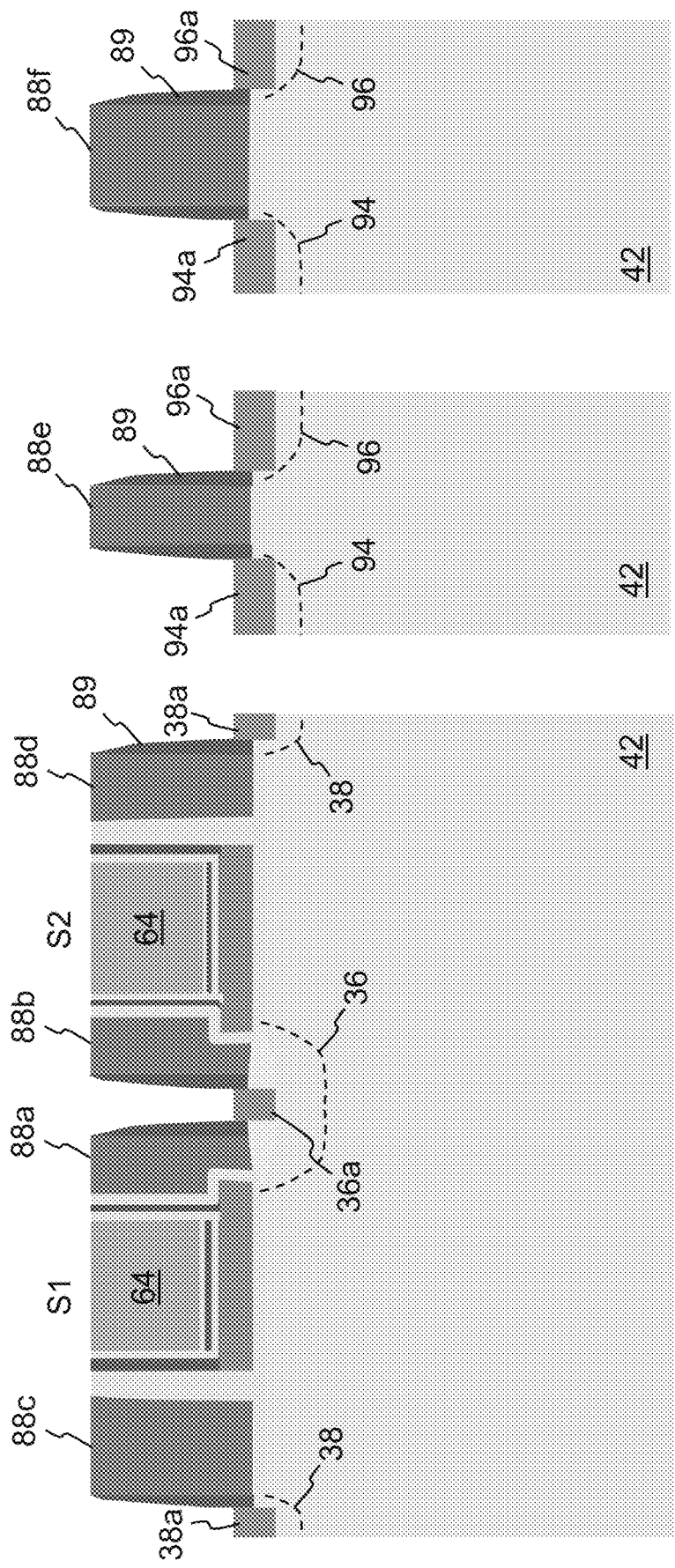

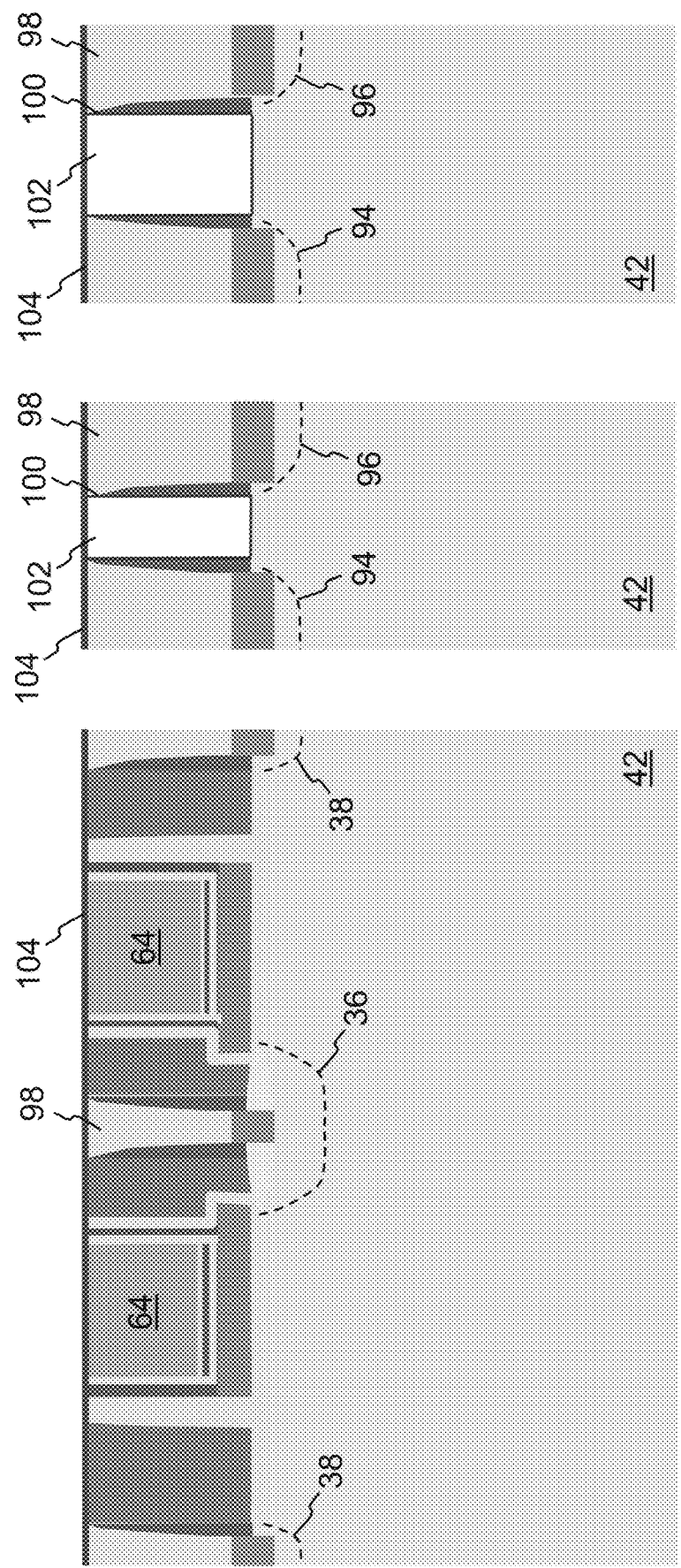

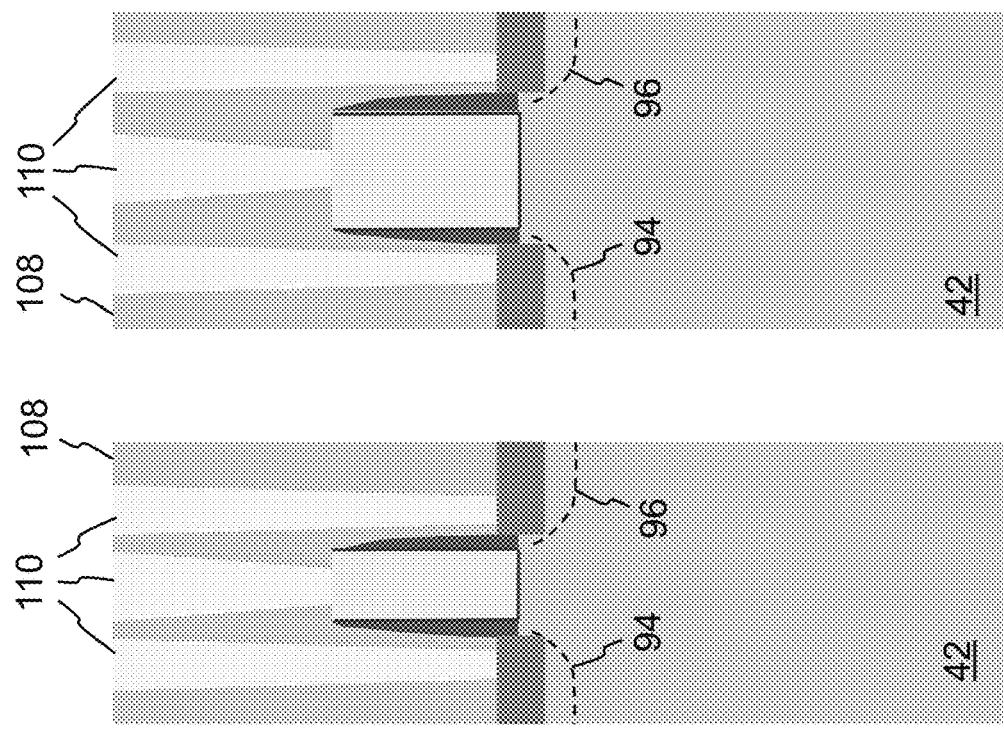
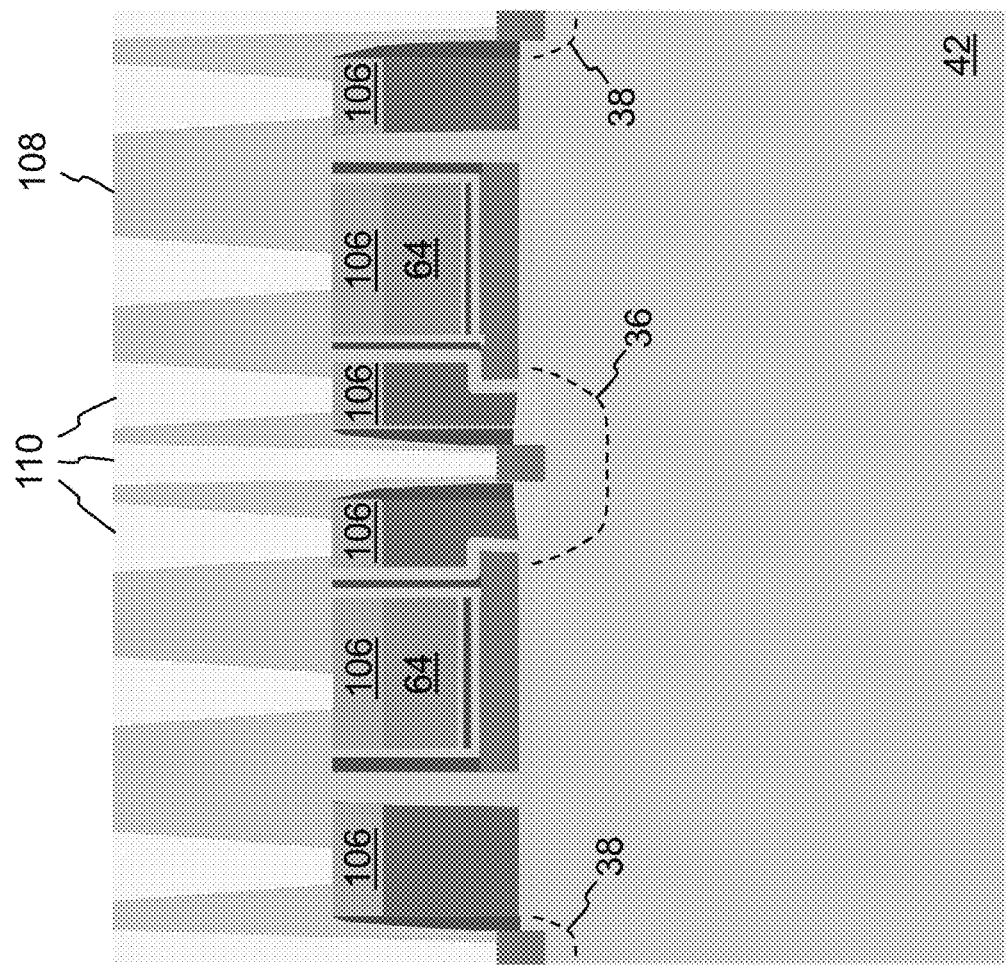
FIG. 24E
FIG. 24C (along a-a)

(along a-a)

US 10,818,680 B2

SPLIT GATE NON-VOLATILE MEMORY CELLS AND LOGIC DEVICES WITH FINFET STRUCTURE, AND METHOD OF MAKING SAME

RELATED APPLICATIONS

This application is a divisional of U.S. application Ser. No. 15/957,615, filed Apr. 19, 2018.

FIELD OF INVENTION

The present invention relates to non-volatile flash memory cell arrays.

BACKGROUND OF THE INVENTION

Split gate non-volatile memory devices are well known in the art. For example, U.S. Pat. No. 7,927,994 discloses a split gate non-volatile memory cell. FIG. 1 illustrates an example of such a split gate memory cell formed on a semiconductor substrate 12. Source and drain regions 16 and 14 are formed as diffusion regions in substrate 12, and define a channel region 18 there between. The memory cell includes four conductive gates: a floating gate 22 disposed over and insulated from a first portion of the channel region 18 and a portion of the source region 16, a control gate 26 disposed over and insulated from the floating gate 22, an erase gate 24 disposed over and insulated from the source region 16, and a select gate 20 disposed over and insulated from a second portion of the channel region 18. A conductive contact 10 can be formed to electrically connect to the drain region 14. Because the channel region is formed along the planar surface of the semiconductor substrate, as device geometries get smaller, so too does total area (e.g. width) of the channel region. This reduces the current flow between the source and drain regions, requiring more sensitive sense amplifiers etc. to detect the state of the memory cell.

Because the problem of shrinking the lithography size thereby reducing the channel width affects all semiconductor devices, a Fin-FET type of structure has been proposed. In a Fin-FET type of structure, a fin shaped member of semiconductor material connects the source to the drain regions. The fin shaped member has two side surfaces. Current from the source to the drain regions can then flow along the two side surfaces. Thus, the width of the channel region is increased, thereby increasing the current flow. However, the width of the channel region is increased without sacrificing more semiconductor real estate by "folding" the channel region into two side surfaces, thereby reducing the "footprint" of the channel region. Non-volatile memory cells using such Fin-FETs have been disclosed, where the floating gates are disposed adjacent to one of the side surfaces of the fin shaped member. Some examples of prior art Fin-FET non-volatile memory structures (although the number and configuration of the gates varies from the above described planar example in FIG. 1) include U.S. Pat. Nos. 7,423,310, 7,410,913 and 8,461,640, and U.S. Patent Publication 2017/0345840. It has also been proposed to form logic devices on fin shaped members. See for example U.S. Patent Publication 2017/0125429 and pending U.S. patent application Ser. No. 15/933,124.

However, these prior art Fin-FET structures have disclosed using the floating gate in stacked gate configuration, or using trapping material, or using SRO (silicon rich oxide) or using nanocrystal silicon to store charges, or other more complicated memory cell configurations.

BRIEF SUMMARY OF THE INVENTION

An improved memory device includes a semiconductor substrate having an upper surface with a plurality of upwardly extending fins, wherein each of the fins includes first and second side surfaces that oppose each other and that terminate in a top surface, a memory cell formed on a first fin of the plurality of fins, and a logic device formed on a second fin of the plurality of fins. The memory cell includes spaced apart source and drain regions in the first fin, with a channel region of the first fin extending along the top surface and the opposing side surfaces of the first fin between the source and drain regions, a floating gate that extends along a first portion of the channel region, wherein the floating gate extends along and is insulated from the first and second side surfaces and the top surface of the first fin, a select gate that extends along a second portion of the channel region, wherein the select gate extends along and is insulated from the first and second side surfaces and the top surface of the first fin, a control gate that extends along and is insulated from the floating gate, and an erase gate that extends along and is insulated from the source region. The logic device includes spaced apart logic source and logic drain regions in the second fin, with a logic channel region of the second fin extending along the top surface and the opposing side surfaces of the second fin between the logic source and drain regions, and a logic gate that extends along the logic channel region, wherein the logic gate extends along and is insulated from the first and second side surfaces and the top surface of the second fin.

Other objects and features of the present invention will become apparent by a review of the specification, claims and appended figures.

BRIEF DESCRIPTION OF THE DRAWINGS

FIGS. 3A-10A, 14A, 16A, 18A-20A are side cross sectional views of the Memory Area (along the c-c line of FIG. 2) showing the steps in forming the memory device of the present invention.

FIGS. 3B-10B, 14B, 16B, 18B-20B are side cross sectional views of the Logic Areas (orthogonal to the fin direction) showing the steps in forming the memory device of the present invention.

FIGS. 10C-13C, 15C, 17C, 19C-25C are side cross sectional views of the Memory Area (along the a-a line of FIG. 2) showing the steps in forming the memory device of the present invention.

FIGS. 10D-13D, 15D, 17D, 19D-20D are side cross sectional views of the Memory Area (along the d-d line of FIG. 2) showing the steps in forming the memory device of the present invention.

FIGS. 21E-25E are side cross sectional views of the Logic Areas (along the fin direction) of showing the steps in forming the memory device of the present invention.

DETAILED DESCRIPTION OF THE INVENTION

Figure 1:
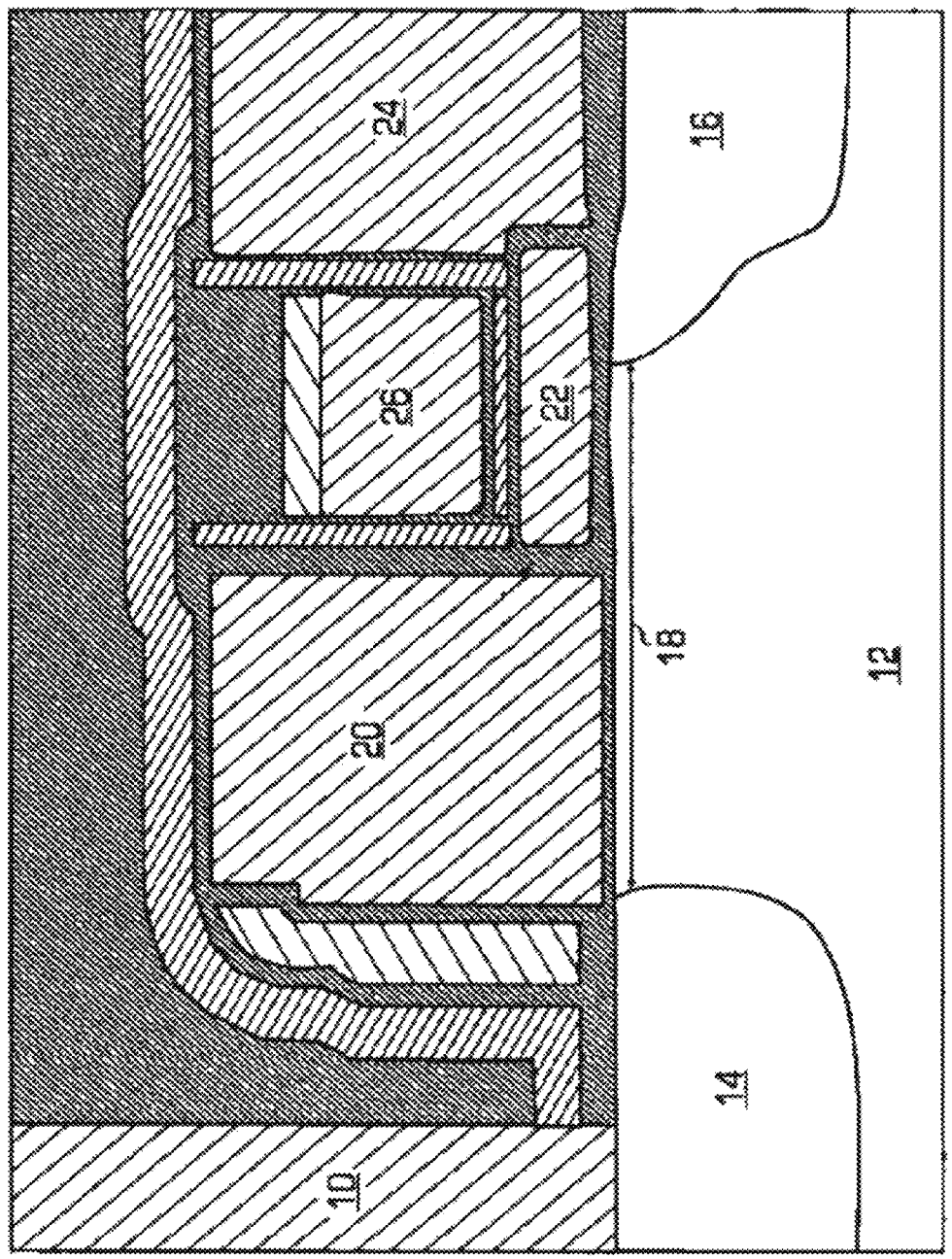
FIG. 1 is a side cross sectional view of a conventional non-volatile memory cell.
Figure 2:
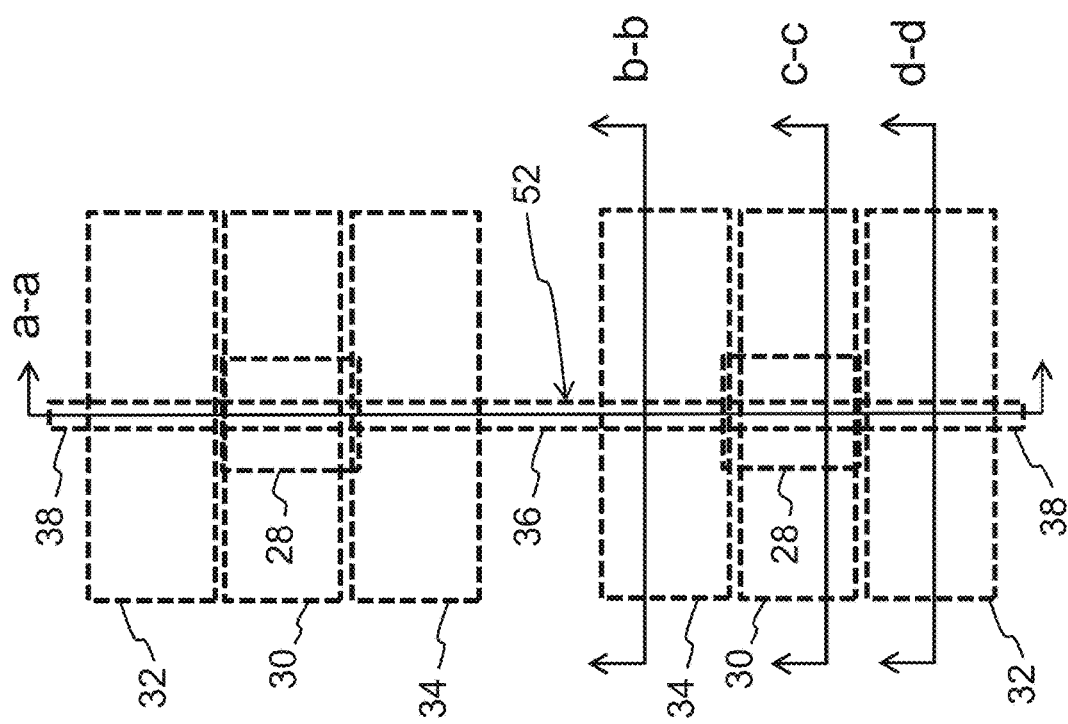
FIG. 2 is a top view of the Memory Area illustrating the various cross sectional view directions for other figures.

The present invention is a memory device having Fin-FET split gate type memory cells each having four gates: a floating gate 28, a control gate 30, a select gate 32 and an erase gate 34. Fin-FET logic devices are formed on the same substrate as the memory cells. FIG. 2 is a top view illustrating the configuration of a mirror pair of memory cells in the memory area of the substrate. The mirror pair of memory cells share a common source region 36 (i.e., a region of the substrate having a second conductivity type different than the first conductivity type of the substrate), where drain regions 38 (of the second conductivity type) are shared among adjacent pairs of memory cells (not shown). The memory cells are formed on a fin shaped portion 52 of the upper surface of a semiconductor substrate 42. FIG. 2 further shows the cross sectional view directions a-a, b-b, c-c and d-d for subsequently described figures.

The fabrication process begins by selectively implanting different areas of a semiconductor substrate 42. The various areas of the substrate 42 are shown in FIGS. 3A and 3B (i.e., FIGS. 3A and 3B show different areas of the same substrate 42), where the substrate has four areas relating to memory cells and logic devices: the Memory Area 42a (in which memory cells are formed), the HV Area 42b (in which high voltage logic devices are formed), the Logic Core Area 42c (in which core logic devices are formed) and the Logic IO Area 42d (in which input/output logic devices are formed). Areas 42b, 42c and 42d are referred to herein collectively as the Logic Areas. Preferably, the selective implantation begins by covering the substrate with a masking material except for the HV Area, which is subjected to one or more implantation steps (e.g., an anti-punchthrough implantation that will prevent source to drain leakage in the high voltage logic devices formed in this area). This can be repeated for the Memory Area (e.g., cover the other areas with masking material, and perform an anti-punchthrough implantation that will prevent source to drain leakage in the memory cells formed in this area).

The upper surface of the Memory Area of the substrate 42 is then recessed (lowered) compared to the Logic Areas of the substrate. This is preferably done by forming a layer of material (e.g., silicon nitride) 44 on the substrate 42, followed by a masking step (i.e., photo resist deposition, selective photolithography exposure and selective photo resist removal), leaving photo resist on the silicon nitride in the Logic Areas, but leaving the silicon nitride exposed in the Memory Area. A silicon nitride etch is used to remove the silicon nitride from the Memory Area leaving the substrate surface exposed, as shown in FIGS. 4A and 4B. The exposed portion of the substrate 42 (in the Memory Area) is oxidized, followed by a wet oxide etch to remove the oxidized portion of the substrate, which effectively removes a top portion of the substrate (effectively lowering/recessing its upper surface). These steps can be repeated until the desired level of surface recess R is achieved (e.g., 300-500 nm). A nitride etch is then used to remove nitride 44. The resulting structure is shown in FIGS. 5A and 5B.

Fins are then formed in the substrate upper surface as follows. A silicon dioxide (oxide) layer 46 is formed on the upper surface in all four areas (Memory, HV, Logic Core and Logic IO) of the substrate 42. A silicon nitride (nitride) layer 48 is formed on oxide layer 46. A hard mask material is formed on the nitride layer 48. Photoresist is formed on the hard mask material and patterned using a masking step to expose strips of the hard mask material. An etch is performed to remove the exposed portions of hard mask material, leaving vertical strips of hard mask material. Oxide spacers are formed along the sides of the hard mask material strips by performing an oxide deposition followed by anisotropic oxide etch, which leaves spacers on vertical sidewalls of hard mask strips. Photoresist is formed over the structures and patterned to leave strips of photoresist covering alternating spacers in the Memory Area (and all the spacers in the other areas). An oxide etch is then used to remove those oxide spacers left exposed by photoresist. After photoresist removal, an etch is performed to remove the hard mask strips. One or more etches are then performed to remove those portions of nitride 48, oxide 46 and upper portions of substrate 42 that are not underneath the oxide spacers, which results in the formation of trenches 50 that extend into the substrate, leaving thin fin structures 52 of the substrate 42 between adjacent trenches 50. Fins 52 extend in the vertical/column direction and are parallel to each other. The resulting structures are shown in FIGS. 6A and 6B (after removal of the oxide spacers).

Figure 6B:
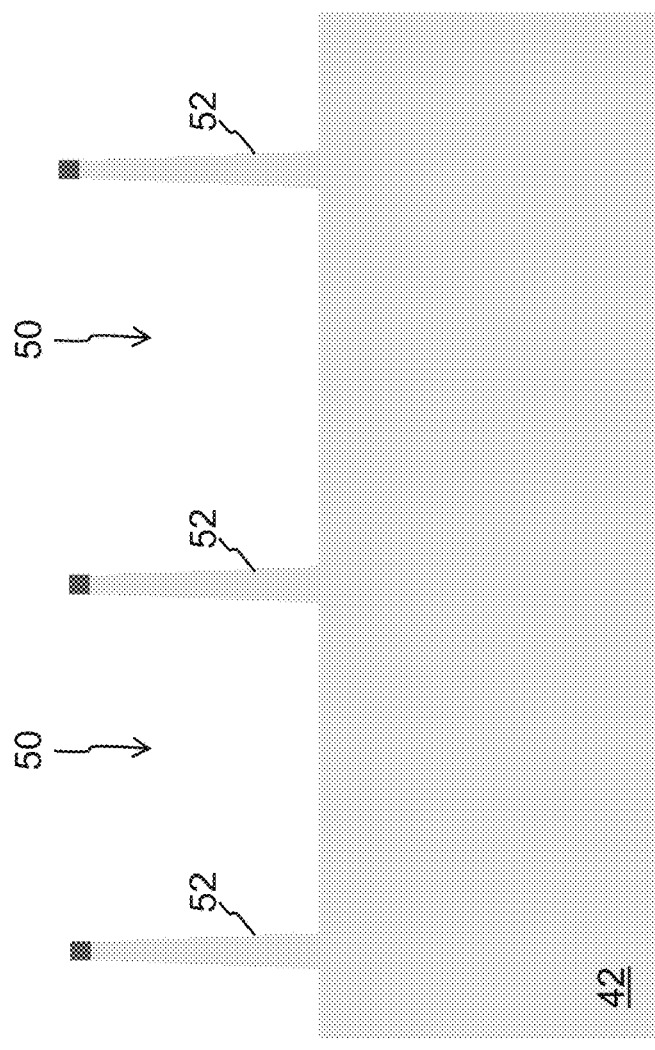
Figure 6A:
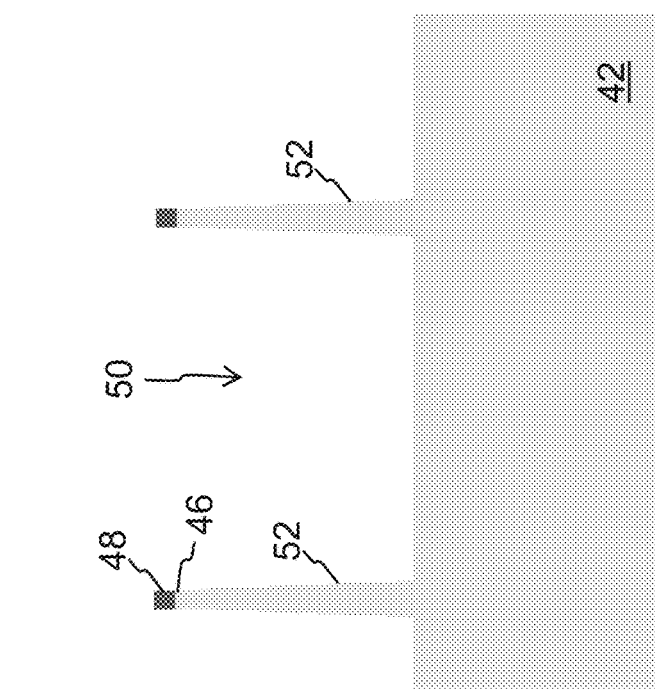

While FIG. 6B only shows one fin 52 in each of the HV, Logic Core and Logic IO Areas, and FIG. 6A only shows two fins 52 in the Memory Area, many multiple fins are formed in each area. While not shown, the spacing between fins will vary based on the area. For example, the distance between adjacent fins in the Logic Core Area preferably is approximately half of the distance that separates adjacent fins in the Memory Area. Insulation material 54 (e.g., oxide) is formed over the structures (including filling trenches 50 with oxide 54), followed by oxide planarization (e.g., CMP) to remove any portion of oxide 54 above the tops of nitride 48. A hard mask layer (e.g., nitride) 56 is formed over the Logic Areas but not over the Memory Area. An oxide etch is then used to recess (i.e., remove the upper portions of) oxide 54 in the Memory Area. The resulting structures are shown in FIGS. 7A and 7B.

The nitride 48 and oxide 46 on the tops of fins 52 in the Memory Area are removed (using photo resist to protect nitride layer 56 in the Logic Areas). A layer of oxide 58 is then formed on the two side surfaces and the top surface of each fin 52 in the Memory Area (e.g., by oxidation). A conformal layer of polysilicon (poly) 60 is then formed on the structures (including on oxide 58), as shown in FIGS. 8A and 8B. In-situ doping of the poly layer 60 is then performed. A masking step and poly etch are performed to remove selected portions of poly layer 60 in the bottom of trenches 50 in the Memory Area (between fins 52). An insulation layer 62 (e.g., ONO, with oxide-nitride-oxide sublayers) is formed on the structures. A thick layer of polysilicon 64 is then formed on ONO layer 62 (which can be subjected to in-situ doping). A hardmask layer 66 is then formed on poly layer 64. The resulting structures are shown in FIGS. 9A and 9B.

A masking step and one or more etches are performed to remove selected portions of the hardmask layer 66, poly layer 64, and ONO layer 62 along the tops of the fins 52 in the Memory Area, leaving pairs of gate stacks S1 and S2 on the top surface of each fin 52 in the Memory Area, as shown in FIGS. 10C-10D (FIGS. 10A and 10B show that no change is made in those locations where material is not removed). An HTO deposition and anneal are performed to form oxide layer 68 along the sides of the gate stacks S1 and S2. A nitride deposition and etch are performed to form nitride layer 70 along oxide layer 68. A sacrificial oxide spacer 72 is formed along the nitride layer 70 by oxide deposition and etch. The resulting structures are shown in FIGS. 11C-11D.

Photo resist 74 is formed between each of the gate stack pairs S1 and S2 using a masking step. A WLVT implant is then performed, followed by an oxide etch that removes oxide spacers 72 on the outer sides of the stack pairs S1 and S2, as shown in FIGS. 12C-12D. After photo resist removal, a poly etch is used to remove exposed portions of the floating gate poly layer 60 (from between stacks S1 and S2), as shown in FIGS. 13C-13D. Photo resist 76 is formed on poly layer 64 in the Memory Area using masking step, followed by a poly etch, which removes poly layer 60 from the Logic Areas, as shown in FIGS. 14A-14B. After photo resist removal, oxide spacers 78 are formed along the outer side walls of the gate stacks S1 and S2 using an oxide deposition and etch (photo resist can be used to protect the other structures), as shown in FIGS. 15C-15D.

Figure 16B:
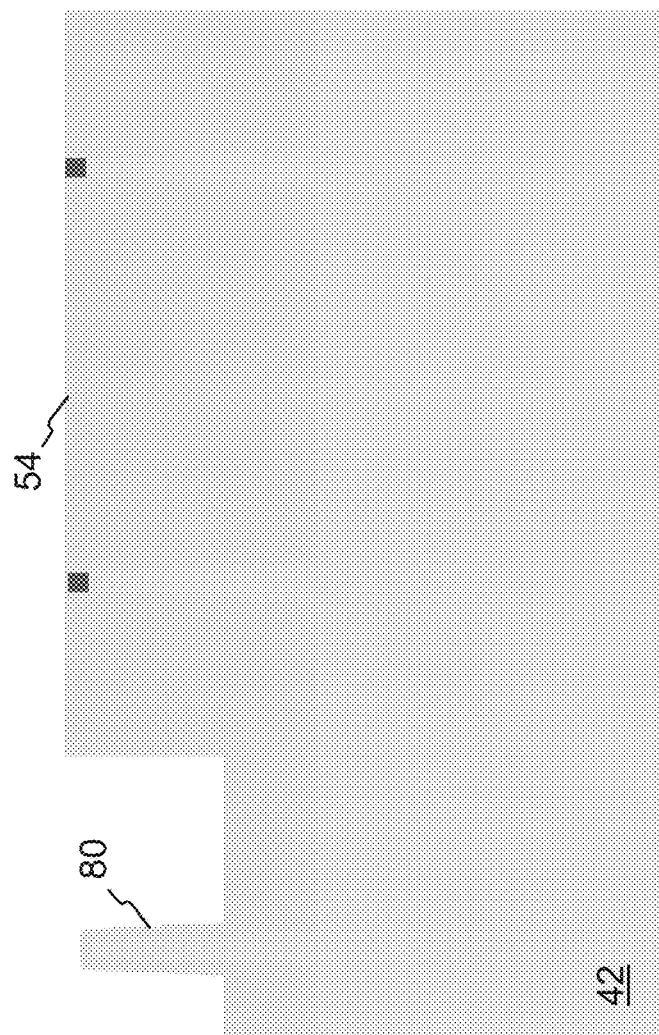
Figure 16A:
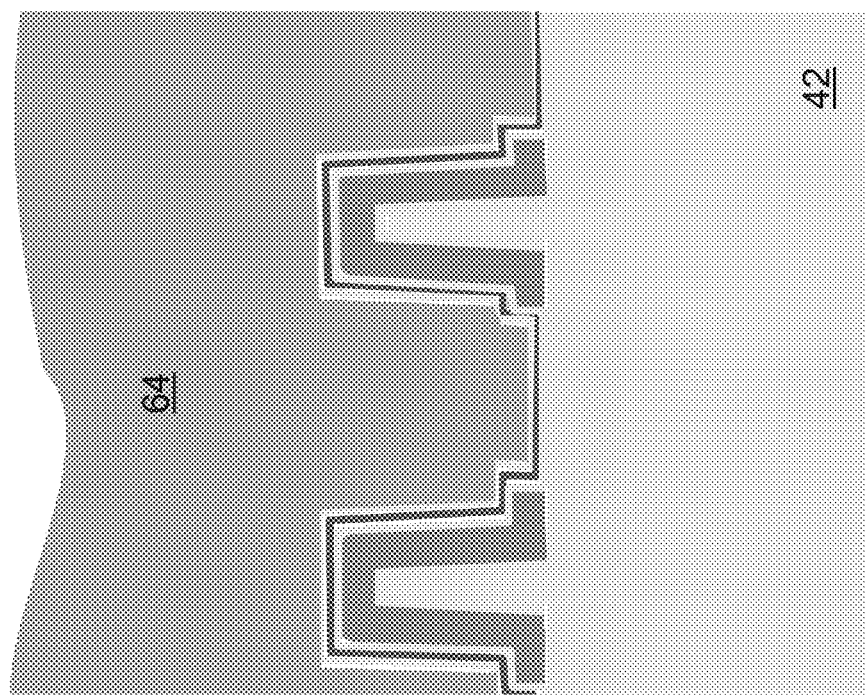

A masking step is used to cover the structures with photo resist except for the HV Area, which is subjected to oxide and nitride etches to remove nitride and oxide on the fins 52, and to recess oxide 54 on either side of the fins 52. An oxide layer 80 is then formed on the exposed fins 52 in the HV Area (e.g., RTO+HTO and anneal), as shown in FIGS. 16A and 16B. A masking step is used to cover the structures with photo resist 82 except for the area between each of the gate stack pairs S1 and S2. An implant is performed in the substrate between each of the gate stack pairs S1 and S2 (i.e., source line implant for source regions to be completed as described below). An oxide etch is then used to remove the spacers 72 in that same region, followed by the formation of tunnel oxide layer 84 on the exposed surfaces of poly layer 60 and the inner sidewalls of gate stacks S1 and S2 (e.g., by wet or partial wet deposition to thicken the oxide on the substrate, followed by HTO deposition to achieve desired thickness on poly layer 60), as shown in FIGS. 17C and 17D.

After photo resist removal, the Memory and HV areas are covered by photo resist, and the Logic Core and Logic IO area are subjected to one or more implantations (which preferably includes an anti-punchthrough implantation that will prevent source to drain leakage in the logic devices formed in these areas). After photo resist removal, photo resist is formed in the area between each of the gate stacks S1 and S2, followed by an oxide etch to remove the oxide on the substrate outside of the pairs of stacks. Photo resist is then formed on the Memory and HV areas, followed by oxide and nitride etches to remove the oxide and nitride on fins 52, and recess oxide 54, in the Logic Core and Logic IO areas. Oxide 86 is then formed on the exposed fins 52 in the Logic Core and Logic IO areas (and other exposed portions of substrate 42), as shown in FIGS. 18A and 18B. Oxide 86 on the fins 52 in the Logic Core and Logic IO areas is thinner than oxide 80 on the fins in the HV area.

Poly layer 88 is formed over the structures, as shown in FIGS. 19A-19D. A chemical mechanical polish (CMP) is used to remove the upper portions of, and planarize, the structures, as shown in FIGS. 20A-20D. A masking step and poly etch are used to remove a center portion of the poly layer 88 between each of the gate stacks S1 and S2, and a portion of poly layer 88 between adjacent pairs of gate stacks, leaving separate poly blocks 88a and 88b between each of gate stacks S1 and S2, and poly blocks 88c and 88d on the outer portions of each pair of gate stacks S1 and S2, as shown in FIG. 21C. The poly etch also removes portions of poly layer 88 on fins 52 in the Logic Core and Logic IO areas, leaving poly blocks 88e in the Logic Core area and poly blocks 88f in the Logic IO area, as shown in FIG. 21E (which is a cross sectional view along the length of the fin in these logic areas). One or more masking and implantation steps are used to selectively implant the substrate in the logic areas.

Nitride deposition and etch are used to form nitride spacers 89 on the exposed sidewalls of the structures. One or more implantations are performed to form source and drain regions in the substrate 42 for the memory cells and logic devices. Specifically, formation of memory cell source regions 36 in the substrate between the gate stacks S1 and S2 is completed. Memory cell drain regions 38 are formed adjacent to poly blocks 88c and 88d. Logic source and drain regions 94 and 96 are formed in the HV, Logic Core and Logic IO areas adjacent the remaining poly blocks 88e and 88f (and poly blocks in the HV area which are not shown), as illustrated in FIGS. 22C and 22E. Preferably, the source and drain regions of the fin for the logic devices and memory cells can be at least partially etched away, followed by a SiGe (for PFet devices) or SiC (for NFet devices) epitaxy process to form raised source and drain regions 36a and 38a for the memory cells and raised source and drain regions 94a and 96a for the logic devices, which induce compressive or tensile stress that improves mobility (i.e., reduces series resistance). A layer of insulation (e.g., oxide) 98 is formed over the structures and planarized (e.g., by CMP using poly blocks 88 as the polish stop). Photo resist is then formed over the memory area, leaving the poly blocks 88e and 88f in the logic areas exposed. Poly blocks 88e and 88f are then removed by poly etch, and replaced with a layer of high K material 100 (i.e., a material having a dielectric constant K greater than that of oxide, such as HfO2, ZrO2, TiO2, Ta2O5, or other adequate materials, etc.), and metal blocks 102. A layer of nitride 104 is then formed on the structures. The resulting structures are shown in FIGS. 23C and 23E. Nitride layer 104 is removed from the Memory Area, and salicide 106 is formed on the exposed top surfaces of poly blocks 88a, 88b, 88c, 88d and 64 (e.g. by Ti sputtering, TiSi anneal and Ti wet strip). Nitride 104 is then removed from the Logic Areas. ILD insulation material 108 is then formed over the structures and planarized (e.g., by CMP). Contact holes are formed through the ILD material 108 using a masking and etch process, after which the contact holes are filled with metal to form metal contacts 110 electrically connected to the various poly/metal blocks and source/drain regions. The resulting structures formed on the top surfaces of fins 52 in the Memory, Logic Core and Logic IO areas are shown in FIGS. 24C and 24E.

Figure 25C:
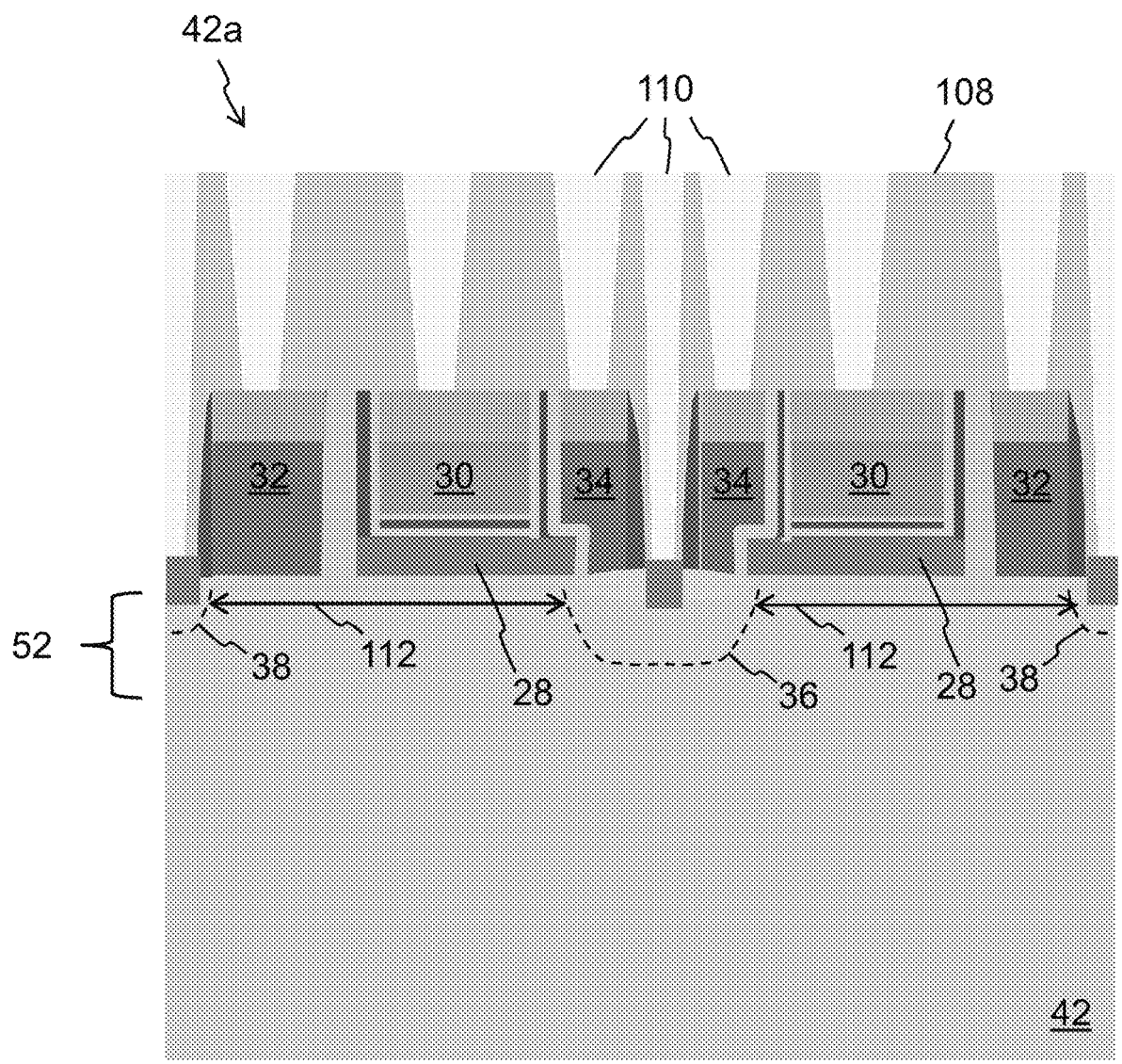

The final structure on and around the fins 52 in the Memory Area 42a is shown in FIG. 25C. Pairs of memory cells are formed end to end along each fin 52. Each memory cell includes a channel region 112 of the substrate that extends between the source and drain regions 36 and 38 (i.e., those portions of the substrate along the two side surfaces and the top surface of the fin 52 between the source/drain regions 36/38). Poly 60 is the floating gate 28, which is disposed over and insulated from a first portion of the channel region 112. Poly 64 is the control gate 30, which extends over and is insulated from the floating gate 28. Poly 88c/d are each the select gates 32, each of which is disposed over and insulated from a second portion of the channel region 112. Poly 88a/b are each the erase gate 34, each of which is adjacent to and insulated from the floating gate 28, and over and insulated from the source region 36. The erase gate 34 includes a notch facing a corner of the floating gate. The fin 52 has two opposing side surfaces and a top surface. The floating gate 28 wraps around the fin 52 so that it is adjacent to and insulated from both opposing side surfaces, as well as the top surface, of the fin 52. The select gate 32 also wraps around the fin 52 so that it is adjacent to and insulated from both opposing side surfaces, and the top surface, of the fin 52. Therefore, one advantage of the present configuration is that the surface area of the channel region 112 is greater in size versus an equally sized memory cell over a planar channel region (i.e., the amount of surface overlap between the floating and select gates and the substrate is greater than the horizontal area of the substrate occupied by these elements).

Figure 25E:
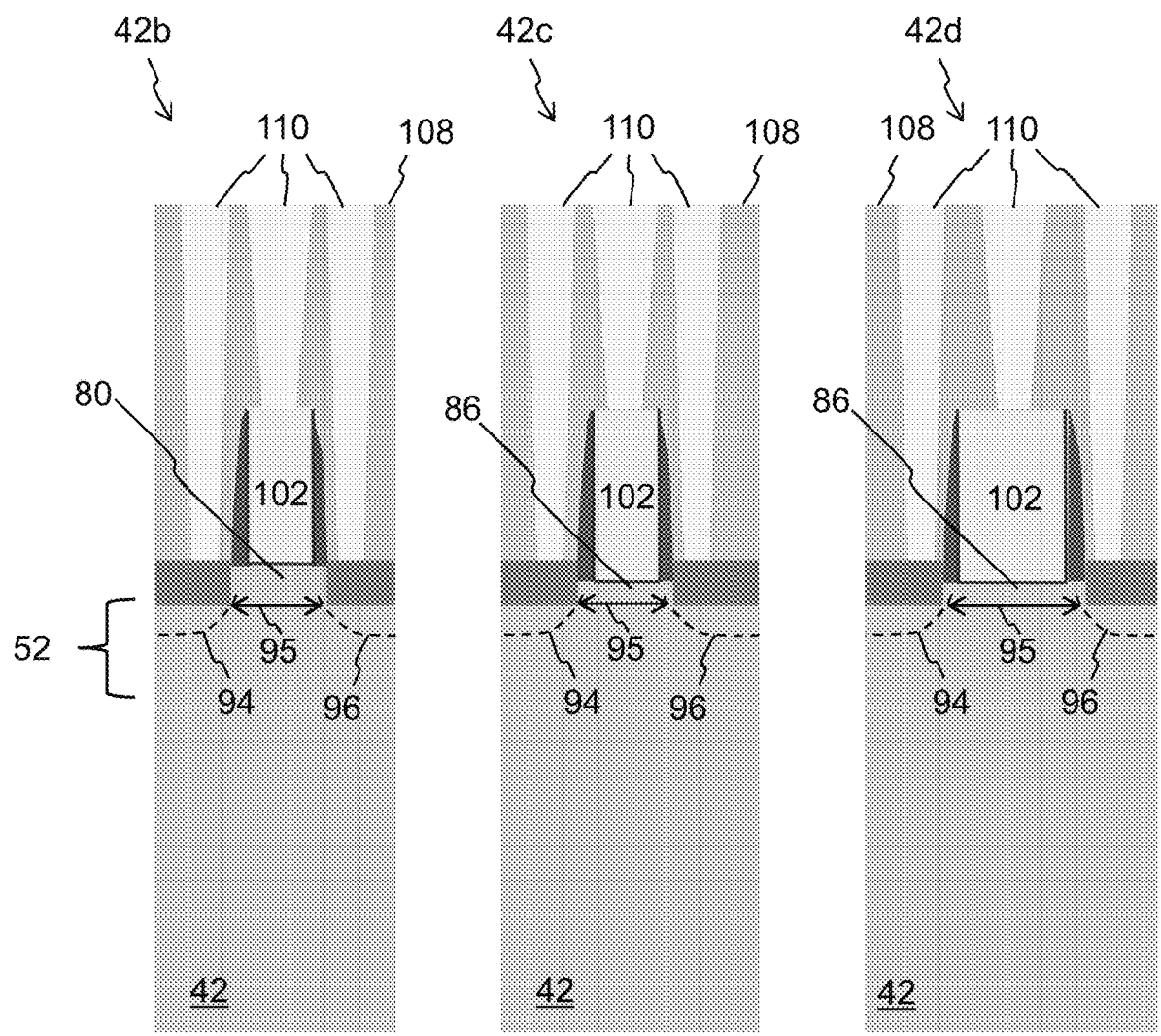

The final structures on and around the fins 52 in the HV Area 42b, the Logic Core Area 42c and the Logic IO Area 42d are shown in FIG. 25E. Logic transistor devices are formed on the fins 52 in the Logic Area. Each logic device includes a conductive gate (i.e. metal blocks 102). The gate oxide 80 under block 102 in the HV Area is thicker than the gate oxide 86 in the other logic areas, for higher voltage operation. Each logic device includes a logic source and drain 94 and 96, with a logic channel region 95 therebetween. The gates 102 each wraps around the respective fin 52 so that it is adjacent to and insulated from both opposing side surfaces, and the top surface, of the fin 52. Therefore, another advantage of the present configuration is that the surface area of the channel region for each of the logic devices is greater in size versus an equally sized logic device over a planar channel region (i.e., the amount of surface overlap between the logic gate and the substrate is greater than the horizontal area of the substrate occupied by this element).

Other advantages include that conformal gates wrapping around the top and both side surfaces of the fin 52 are formed both in the Memory Area (i.e., floating and select gates) and the Logic Area (i.e., logic gates). Further, by recessing the fins in the Memory Area, the tops of the memory cells and the logic devices are approximately equal to each other, even though the gate stacks of the memory cells are taller than the logic gates of the logic devices. In addition, memory cells and three different types of logic devices are all formed on fin shaped substrate structures of the same semiconductor substrate, where each memory cell is formed on a single fin, and each logic device is formed on a single fin, which enables a reduction of fin-to-fin spacing.

It is to be understood that the present invention is not limited to the embodiment(s) described above and illustrated herein, but encompasses any and all variations falling within the scope of any claims supported thereby. For example, references to the present invention herein are not intended to limit the scope of any claim or claim term, but instead merely make reference to one or more features that may be covered by one or more claims. Materials, processes and numerical examples described above are exemplary only, and should not be deemed to limit any claims. Further, not all method steps need be performed in the exact order illustrated. The fins could continuously extend between memory and logic areas. For example, one or more fins in the Memory Area (on which memory cells are formed) could continuously extend out of the Memory Area and into the Logic Area (on which logic devices are formed), in which case memory devices and logic devices could be formed on the same continuously formed fin. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A memory device, comprising:
a semiconductor substrate having an upper surface with a plurality of upwardly extending fins, wherein each of the fins includes first and second side surfaces that oppose each other and that terminate in a top surface;
a memory cell formed on a first fin of the plurality of fins, comprising:
spaced apart source and drain regions in the first fin, with a channel region of the first fin extending along the top surface and the opposing side surfaces of the first fin between the source and drain regions,
a floating gate that extends along a first portion of the channel region, wherein the floating gate extends along and is insulated from the first and second side surfaces and the top surface of the first fin,
a select gate that extends along a second portion of the channel region, wherein the select gate extends along and is insulated from the first and second side surfaces and the top surface of the first fin,
a control gate that extends along and is insulated from the floating gate, and
an erase gate that extends along and is insulated from the source region;
a logic device formed on a second fin of the plurality of fins, comprising:
spaced apart logic source and logic drain regions in the second fin, with a logic channel region of the second fin extending along the top surface and the opposing side surfaces of the second fin between the logic source and drain regions, and
a logic gate that extends along the logic channel region, wherein the logic gate extends along and is insulated from the first and second side surfaces and the top surface of the second fin;
wherein the first and second fins are formed as a single continuous fin.

2. A memory device, comprising:
a semiconductor substrate having an upper surface with a plurality of upwardly extending fins, wherein each of the fins includes first and second side surfaces that oppose each other and that terminate in a top surface;
a memory cell formed on a first fin of the plurality of fins, comprising:
spaced apart source and drain regions in the first fin, with a channel region of the first fin extending along the top surface and the opposing side surfaces of the first fin between the source and drain regions,
a floating gate that extends along a first portion of the channel region, wherein the floating gate extends along and is insulated from the first and second side surfaces and the top surface of the first fin,
a select gate that extends along a second portion of the channel region, wherein the select gate extends along and is insulated from the first and second side surfaces and the top surface of the first fin, a control gate that extends along and is insulated from the floating gate, and an erase gate that extends along and is insulated from the source region;

a logic device formed on a second fin of the plurality of fins, comprising:

spaced apart logic source and logic drain regions in the second fin, with a logic channel region of the second fin extending along the top surface and the opposing side surfaces of the second fin between the logic source and drain regions, and a logic gate that extends along the logic channel region, wherein the logic gate extends along and is insulated from the first and second side surfaces and the top surface of the second fin;

wherein the first and second fins are formed as separate, discrete fins, and wherein the second fin extends higher than the first fin relative to the substrate.

3. The memory device of claim 2, wherein the erase gate extends along and is insulated from the first and second side surfaces and the top surface of the first fin, and extends along and is insulated from an upper edge of the floating gate.

4. The memory device of claim 3, wherein the erase gate includes a notch facing the upper edge of the floating gate.

5. The memory device of claim 2, wherein the logic gate includes a metal material, and wherein the logic gate is insulated from the first and second side surfaces and the top surface of the second fin by a high K insulation material.

6. The memory device of claim 5, wherein the floating gate, the select gate, the control gate, and the erase gate each include polysilicon material.

7. The memory device of claim 2, further comprising:
a second logic device formed on a third fin of the plurality of fins, comprising:

spaced apart second logic source and logic drain regions in the third fin, with a second logic channel region of the third fin extending along the top surface and the opposing side surfaces of the third fin between the second logic source and drain regions, and a second logic gate that extends along the second logic channel region, wherein the second logic gate extends along and is insulated from the first and second side surfaces and the top surface of the third fin.

8. The memory device of claim 7, wherein:
the logic gate is insulated from the second fin by first insulation material;
the second logic gate is insulated from the third fin by second insulation material;
the first insulation material has a thickness that is greater than that of the second insulation material.

9. The memory device of claim 2, further comprising:
a second memory cell formed on the first fin, comprising:
a second drain region spaced apart from the source region in the first fin, with a second channel region of the first fin extending along the top surface and the opposing side surfaces of the first fin between the source and second drain regions, a second floating gate that extends along a first portion of the second channel region, wherein the second floating gate extends along and is insulated from the first and second side surfaces and the top surface of the first fin, a second select gate that extends along a second portion of the second channel region, wherein the second select gate extends along and is insulated from the first and second side surfaces and the top surface of the first fin, a second control gate that extends along and is insulated from the second floating gate, and a second erase gate that extends along and is insulated from the source region.

* * * * *